US012710654B2

(12) United States Patent
Pagano et al.

(10) Patent No.: US 12,710,654 B2
(45) Date of Patent: Aug. 18, 2026

(54) METHODS, SYSTEMS, APPARATUSES, AND DEVICES FOR FACILITATING PROVISIONING OF A VIRTUAL EXPERIENCE VIA AN INTENSITY CONTROLLABLE XR DISPLAY PANEL

(71) Applicant: Red Six Aerospace Inc., Orlando, FL (US)

(72) Inventors: Glenn Pagano, Los Angeles, CA (US); David Ryan Bonelli, Hayward, CA (US); Adam Eastman, Santa Monica, CA (US); Andrew Ricci, Los Angeles, CA (US)

(73) Assignee: RED SIX AEROSPACE INC, Orlando, FL (US)

(*) Notice: Subject to any disclaimer, the term of this patent is extended or adjusted under 35 U.S.C. 154(b) by 21 days.

(21) Appl. No.: 18/523,128

(22) Filed: Nov. 29, 2023

(65) Prior Publication Data

US 2024/0176149 A1 May 30, 2024

Related U.S. Application Data

(60) Provisional application No. 63/434,645, filed on Dec. 22, 2022, provisional application No. 63/428,601, (Continued)

(51) Int. Cl.

*G02F 1/1333* (2006.01)
*G02B 27/01* (2006.01)
(Continued)

(52) U.S. Cl.

CPC ..... *G02B 27/0172* (2013.01); *G02B 27/0176* (2013.01); *G02F 1/133385* (2013.01); (Continued)

(58) Field of Classification Search

CPC .............. G02F 1/133385; G09G 3/002; G02B 2027/0112; G02B 2027/013; (Continued)

(56) References Cited

U.S. PATENT DOCUMENTS 4,997,263 A 3/1991 Cohen
5,499,139 A 3/1996 Chen
(Continued)

FOREIGN PATENT DOCUMENTS

| | | | | |
|---|---|---|---|---|
| CN | 106324838 | | 1/2017 | |
| EP | 3264160 B1 | * | 8/2019 | ............. G03B 29/00 |
| WO | WO-2023007329 A1 | * | 2/2023 | |

OTHER PUBLICATIONS

International Search Report and Written Opinion of the International Searching Authority mailed Jul. 24, 2024, in International Application No. PCT/US2024/017286. 12 pages.
(Continued)

*Primary Examiner* — Ricardo Osorio
(74) *Attorney, Agent, or Firm* — FisherBroyles LLP

(57) ABSTRACT

A helmet mounted XR display includes a backlit LCD display panel including a backlight having a front edge and a back edge wherein the backlight is configured to be less than approximately 30 mm between a front edge and a back edge, the back edge being an edge configured to be close to a forehead of a user, and produce more than 20,000 nits, a mounting bracket arranged to secure the backlit LCD display panel to a helmet and a partially see-through combiner positioned to present digital content in the form of image light produced by the backlit LCD display panel to an eye of the user such that the user sees the digital content overlaid on an external environment having a brightness of more than 10,000 nits.

16 Claims, 19 Drawing Sheets

Related U.S. Application Data filed on Nov. 29, 2022, provisional application No. 63/428,606, filed on Nov. 29, 2022.

(51) Int. Cl.
*G09G 3/00* (2006.01)
*H05K 7/20* (2006.01)

(52) U.S. Cl.
CPC ......... *G09G 3/002* (2013.01); *H05K 7/20963* (2013.01); *G02B 2027/0112* (2013.01); *G02B 2027/013* (2013.01)

(58) Field of Classification Search
CPC ............ G02B 27/0172; G02B 27/0176; G02B 2027/0118; H05K 7/20963
See application file for complete search history.

(56) References Cited

U.S. PATENT DOCUMENTS

| | | | | |
|---|---|---|---|---|
| 6,160,666 | A | 12/2000 | Rallison | |
| 9,511,870 | B2 | 12/2016 | Dabaga | |
| 10,437,325 | B2 * | 10/2019 | Le Gros | G02B 27/0093 |
| 10,732,407 | B1 | 8/2020 | Wood | |
| 11,067,802 | B1 | 7/2021 | Harrison | |
| 2005/0066275 | A1 | 3/2005 | Gannon | |
| 2006/0017654 | A1 * | 1/2006 | Romo | G06F 3/016 345/592 |
| 2007/0236800 | A1 | 10/2007 | Cakmakci | |
| 2008/0273005 | A1 | 11/2008 | Chen | |
| 2011/0077804 | A1 | 3/2011 | He | |
| 2012/0002256 | A1 | 1/2012 | Lacoste | |
| 2012/0212400 | A1 | 8/2012 | Border | |
| 2013/0278631 | A1 | 10/2013 | Border | |
| 2014/0132629 | A1 | 5/2014 | Pandey | |
| 2014/0140654 | A1 | 5/2014 | Brown | |
| 2015/0187330 | A1 | 7/2015 | Yang | |
| 2016/0306533 | A1 | 10/2016 | Agarwal | |
| 2018/0188542 | A1 | 7/2018 | Waldern | |
| 2018/0275399 | A1 * | 9/2018 | Zhang | G02B 27/0172 |
| 2018/0284440 | A1 | 10/2018 | Popovich | |
| 2019/0179149 | A1 | 6/2019 | Curtis | |
| 2019/0310481 | A1 | 10/2019 | Blum | |
| 2020/0098335 | A1 * | 3/2020 | Chen | G09G 5/10 |
| 2020/0146546 | A1 * | 5/2020 | Chene | A61B 3/0008 |
| 2021/0008981 | A1 | 1/2021 | Suzuki | |
| 2021/0239972 | A1 | 8/2021 | Robinson | |
| 2021/0278875 | A1 * | 9/2021 | Allin | G02B 27/0176 |
| 2021/0311312 | A1 | 10/2021 | Ato | |
| 2022/0187655 | A1 | 6/2022 | Park | |
| 2022/0334392 | A1 | 10/2022 | Kim | |
| 2024/0118746 | A1 | 4/2024 | Yerkes | |
| 2024/0160013 | A1 | 5/2024 | El-Haddad | |

OTHER PUBLICATIONS

International Search Report mailed Mar. 26, 2024, in International Application No. PCT/US2023/081630. 3 pages.
Written Opinion of the International Searcing Authority mailed Mar. 26, 2024, in International Application No. PCT/US2023/081630. 9 pages.

* cited by examiner

METHODS, SYSTEMS, APPARATUSES, AND DEVICES FOR FACILITATING PROVISIONING OF A VIRTUAL EXPERIENCE VIA AN INTENSITY CONTROLLABLE XR DISPLAY PANEL

CROSS REFERENCE TO RELATED APPLICATIONS

The present patent application claims the benefit of U.S. Provisional Patent Application 63/428,606, filed Nov. 29, 2022, U.S. Provisional Patent Application 63/434,645, filed Dec. 22, 2022, and U.S. Provisional Patent Application 63/428,601, filed Nov. 29, 2022, the entire disclosures of each of which are hereby incorporated by reference.

FIELD OF THE INVENTION

Generally, the present disclosure relates to the field of data processing. More specifically, the present disclosure relates to methods, systems, apparatuses, and devices for facilitating provisioning of a virtual experience.

BACKGROUND OF THE INVENTION

Mixed reality head worn displays have become an important enabler of a relatively new user experience. Therefore, there is a need for a high-resolution display with a very wide field of view has proven elusive even though it is highly desired.

SUMMARY

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

In accordance with exemplary and non-limiting embodiments, a helmet mounted XR display comprises a backlit LCD display panel comprising a backlight having a front edge and a back edge wherein the backlight is configured to be less than approximately 30 mm between a front edge and a back edge, the back edge being an edge configured to be close to a forehead of a user, and produce more than 20,000 nits, a mounting bracket arranged to secure the backlit LCD display panel to a helmet and a partially see-through combiner positioned to present digital content in the form of image light produced by the backlit LCD display panel to an eye of the user such that the user sees the digital content overlaid on an external environment having a brightness of more than 10,000 nits.

BRIEF DESCRIPTION OF THE DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAIL DESCRIPTIONS OF THE INVENTION

Figure 1:
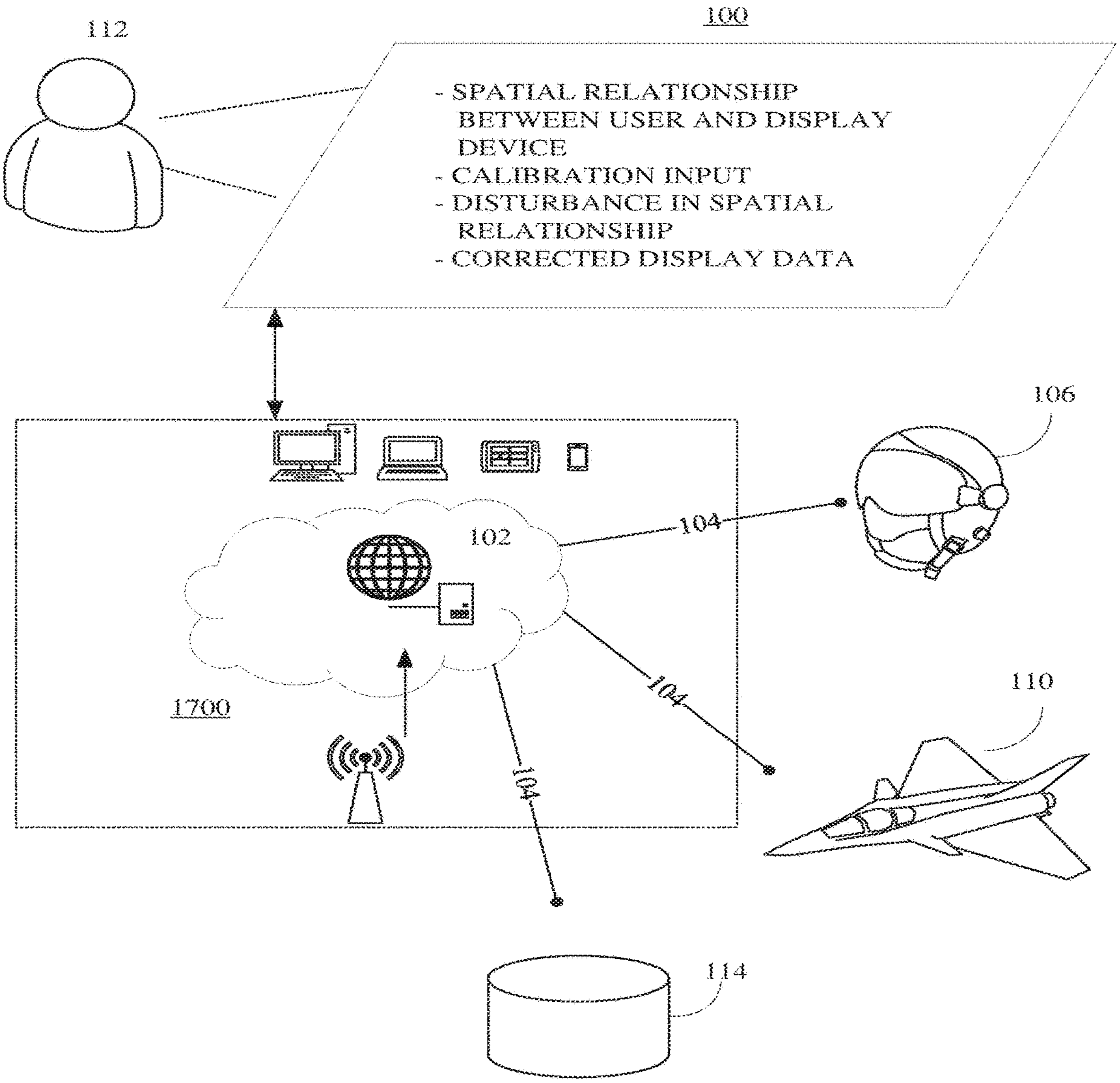
FIG. 1 is an illustration of an online platform consistent with various embodiments of the present disclosure.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of facilitating provisioning of a virtual experience, embodiments of the present disclosure are not limited to use only in this context.

FIG. 1 is an illustration of an online platform 100 consistent with various embodiments of the present disclosure. By way of non-limiting example, the online platform 100 to facilitate provisioning of a virtual experience may be hosted on a centralized server 102, such as, for example, a cloud computing service. The centralized server 102 may communicate with other network entities, such as, for example, an augmented and virtual reality display device 106, a sensor system 110 of an aircraft, database 114 (such as 3D model database) over a communication network 104, such as, but not limited to, the Internet. Further, users of the online platform 100 may include relevant parties such as, but not limited to, trainees, trainers, pilots, administrators, and so on.

A user 112, such as the one or more relevant parties, may access online platform 100 through a web based software application or browser. The web based software application may be embodied as, for example, but not be limited to, a website, a web application, a desktop application, and a mobile application compatible with a computing device 1000.

Figure 2:
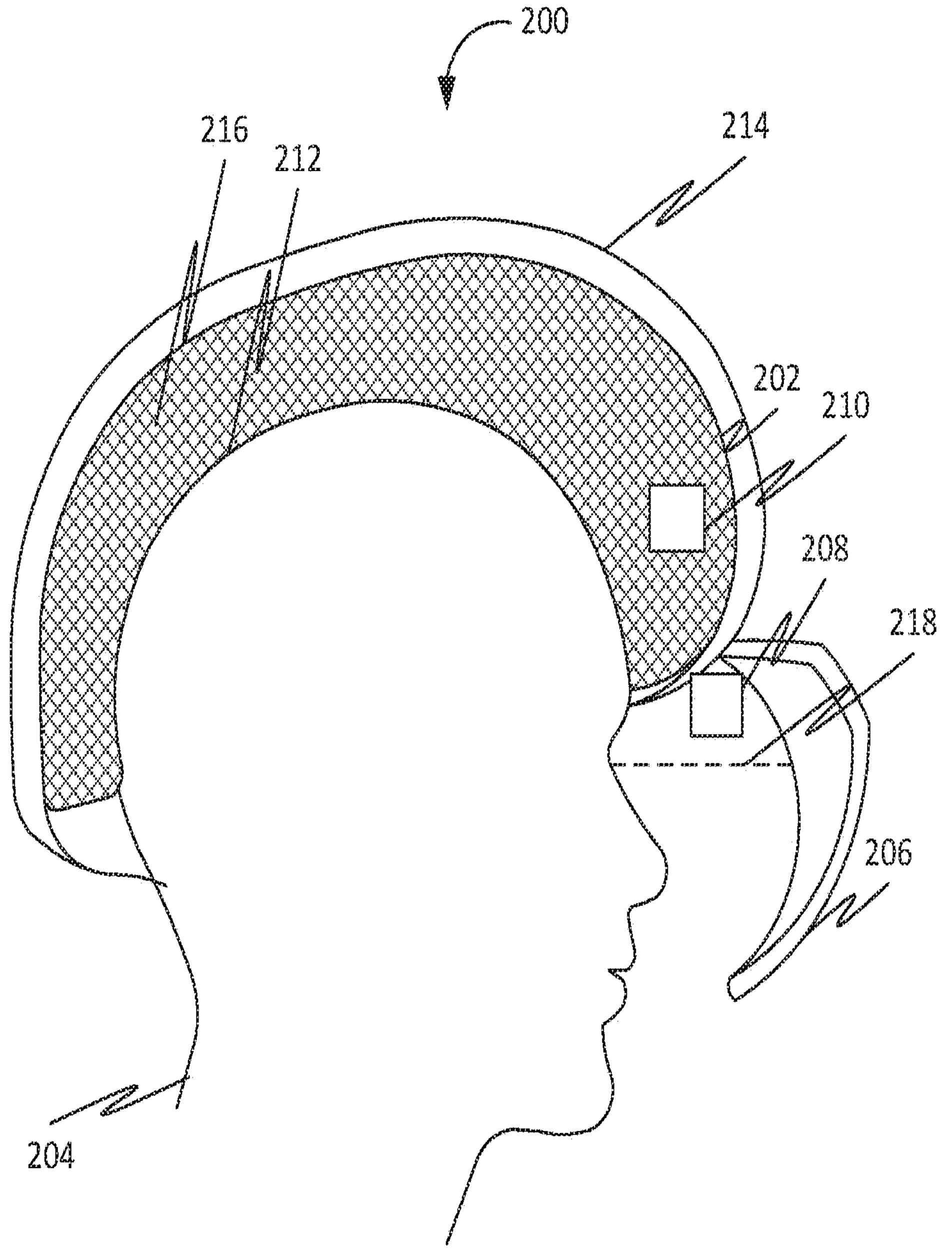
FIG. 2 shows a wearable display device for facilitating provisioning of a virtual experience, in accordance with some embodiments.

FIG. 2 shows a wearable display device 200 for facilitating provisioning of a virtual experience. In some embodiments, the wearable display device 200 may be utilized in conjunction with and/or to effectuate and/or facilitate operation of any element described elsewhere herein or illustrated in any figure herein. Further, the wearable display device 200 may include a support member 202 configured to be mounted on a user 204. Further, the support member 202 may include a structure allowing the support member 202 to be easily mountable on the user 204. For instance, the wearable display device 200 may include a head mounted device (HMD). Further, the wearable display device 200 may include a display device 206 attached to the support member 202. For instance, if the wearable display device 200 is an HMD, the HMD may include a display device in front of one eye of the user 204, (a monocular HMD), in front of both eyes of the user 204, (a binocular HMD), an optical display device (which may reflect projected images), and so on. Further, the display device 206 may be configured for displaying at least one display data. Further, the display data may include virtual reality data related to a simulation, such as a training simulation. For instance, the training simulation may correspond to vehicular racing, such as Formula 1®, and may be used by race car drivers to train for race events. Further, in an instance, the training simulation may correspond to flight training, and may be used by air force pilots for flight training in fighter aircraft. Further, in some embodiments, the display data may include augmented reality data. Accordingly, the display data may include one or more augmented reality components overlaid on top of live image. For instance, the augmented reality data may be related to flight training including a first aircraft training simultaneously with a plurality of aircrafts in different locations. Accordingly, the augmented reality data may include augmented reality components displaying the plurality of plurality of aircrafts in different locations to a display device associated with a pilot of the first aircraft. Further, the wearable display device 200 may include at least one disturbance sensor 208 configured for sensing a disturbance in a spatial relationship between the display device 206 and the user 204. Further, the spatial relationship between the display device 206 and the user 204 may include at least one of a distance and an orientation. For instance, the spatial relationship may include an exact distance, and an orientation, such as a precise angle between the display device 206 and the eyes of the user 204.

Further, the disturbance in the spatial relationship may include a change in at least one of the distance and the orientation between the display device 206 and the user 204. Further, the disturbance in the spatial relationship may lead to an alteration in how the user 204 may view the at least one display data. For instance, if the disturbance in the spatial relationship leads to a reduction in the distance between the display device 206 and the user 204, the user 204 may perceive one or more objects in the at least one display data to be closer. For instance, if the spatial relationship between the display device 206 and the user 204 specifies a distance of "x" centimeters, and the disturbance in the spatial relationship leads to a reduction in the distance between the display device 206 and the user 204 to "y" centimeters, the user 204 may perceive the at least one display data to be closer by "x-y" centimeters.

Further, the wearable display device 200 may include a processing device 210 communicatively coupled with the display device 206. Further, the processing device 210 may be configured for receiving the at least one display data. Further, the processing device 210 may be configured for analyzing the disturbance in the spatial relationship. Further, the processing device 210 may be configured for generating a correction data based on the analyzing. Further, the processing device 210 may be configured for generating a corrected display data based on the at least one display data and the correction data. Further, the correction data may include an instruction to shift a perspective view of the at least one display data to compensate for the disturbance in the spatial relationship between the display device 206 and the user 204. Accordingly, the correction data may be generated contrary to the disturbance in the spatial relationship.

For instance, the disturbance may include an angular disturbance, wherein the display device 206 may undergo an angular displacement as a result of the angular disturbance. Accordingly, the correction data may include an instruction of translation of the display data to compensate for the angular disturbance. Further, the display data may be translated along a horizontal axis of the display data, a vertical axis of the display data, a diagonal axis of the display data, and so on, to negate the angular displacement of the display data.

Further, in an instance, the disturbance may include a longitudinal disturbance, wherein the display device 206 may undergo a longitudinal displacement as a result of the longitudinal displacement. Accordingly, the correction data may include an instruction of translation of the display data to compensate for the longitudinal disturbance. Further, the display data may be projected along a distance perpendicular to a line of sight of the user 204 to negate the angular displacement of the display data. For instance, the display data may be projected along a distance perpendicular to the line of sight of the user 204 opposite to a direction of the longitudinal disturbance to compensate for the longitudinal disturbance.

Further, the support member 202 may include a head gear configured to be mounted on a head of the user 204. Further, the head gear may include a helmet configured to be worn over a crown of the head. Further, the head gear may include a shell configured to accommodate at least a part of a head of the user 204. Further, a shape of the shell may define a concavity to facilitate accommodation of at least the part of the head. Further, the shell may include an interior layer 212, an exterior layer 214 and a deformable layer 216 disposed in between the interior layer 212 and the exterior layer 214. Further, the deformable layer 216 may be configured to provide cushioning. Further, the display device 206 may be attached to at least one of the interior layer 212 and the exterior layer 214.

Further, the disturbance in the spatial relationship may be based on a deformation of the deformable layer 216 due to an acceleration of the head gear. Further, the spatial relationship may include at least one vector representing at least one position of at least one part of the display device 206 in relation to at least one eye of the user 204. Further, a vector of the at least one vector may be characterized by an orientation and a distance. For instance, the spatial relationship between the display device 206 and the user 204 may include at least one of a distance and an orientation. For instance, the spatial relationship may include an exact distance, and an orientation, such as a precise angle between the display device 206 and the eyes of the user 204. Further, the spatial relationship may describe an optimal arrangement of the display device 206 with respect to the user 204. Further, so that the optimal arrangement of the display device 206 with respect to the user 204 may allow the user to clearly view the display data without perceived distortion.

Further, in some embodiments, the at least one disturbance sensor 208 may include an accelerometer configured for sensing the acceleration. Further, in some embodiments, the at least one disturbance sensor 208 may include at least one proximity sensor configured for sensing at least one proximity between the at least one part of the display device 206 and the user 204. Further, in some embodiments, the at least one disturbance sensor 208 may include a deformation sensor configured for sensing a deformation of the deformable layer 216.

Further, in some embodiments, the display device 206 may include a see-through display device 206 configured to allow the user 204 to view a physical surrounding of the wearable device.

Further, in some embodiments, the at least one display data may include at least one object model associated with at least one object. Further, in some embodiments, the generating of the corrected display data may include applying at least one transformation to the at least one object model based on the correction data.

Further, the applying of the at least one transformation to the at least one object model based on the correction data may include translation of the display data to compensate for the angular disturbance. For instance, the correction data may include one or more instructions to translate the display data along a horizontal axis of the display data, a vertical axis of the display data, a diagonal axis of the display data, and so on, to negate the angular displacement of the display data. Accordingly, the applying of the at least one transformation to the at least one object model based on the correction data may include translation of the display data along the horizontal axis, the vertical axis, and the diagonal axis of the display data, to negate the angular displacement of the display data. Further, in an instance, if the correction data includes an instruction of translation of the display data to compensate for the longitudinal disturbance, the applying of the at least one transformation to the at least one object model based on the correction data may include translation may include projection of the display data along a distance perpendicular to a line of sight of the user 204 to negate the angular displacement of the display data. For instance, the applying of the at least one transform may include projection of the display data along a distance perpendicular to the line of sight of the user 204 opposite to a direction of the longitudinal disturbance to compensate for the longitudinal disturbance.

Further, in some embodiments, the at least one disturbance sensor 208 may include a camera configured to capture an image of each of a face of the user 204 and at least a part of the head gear. Further, the spatial relationship may include disposition of at least the part of the head gear in relation to the face of the user 204.

Further, in some embodiments, the at least one disturbance sensor 208 may include a camera disposed on the display device 206. Further, the camera may be configured to capture an image of at least a part of a face of the user 204. Further, the wearable display device 200 may include a calibration input device configured to receive a calibration input. Further, the camera may be configured to capture a reference image of at least the part of the face of the user 204 based on receiving the calibration input. Further, the calibration input may be received in an absence of the disturbance. For instance, the calibration input device may include a button configured to be pushed by the user 204 in absence of the disturbance whereupon the reference image of at least the part of the face of the user 204 may be captured. Further, the analyzing of the disturbance may include comparing the reference image with a current image of at least the part of the face of the user 204. Further, the current image may be captured by the camera in a presence of the disturbance. Further, determining the correction data may include determining at least one spatial parameter change based on the comparing. Further, the at least one spatial parameter change may correspond to at least one of a displacement of at least the part of the face relative to the camera and a rotation about at least one axis of at least the part of the face relative to the camera.

Further, in some embodiments, the generating of the corrected display data may include applying at least one image transform on the at least one display data based on the at least one spatial parameter change.

Further, in some embodiments, the wearable display device 200 may include at least one actuator coupled to the display device 206 and the support member 202. Further, the at least one actuator may be configured for modifying the spatial relationship based on a correction data.

Figure 3:
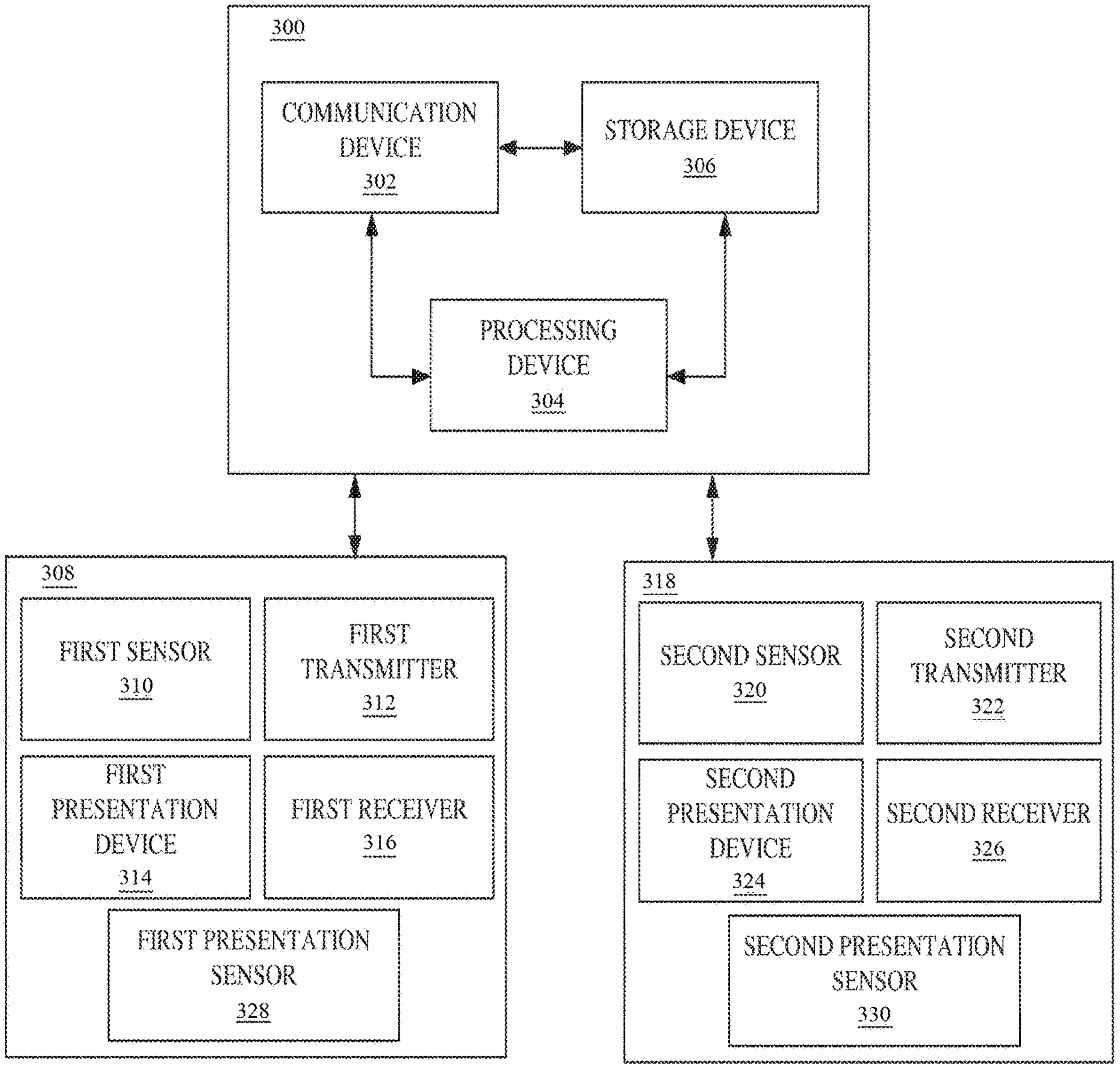
FIG. 3 is a block diagram of a system for facilitating provisioning of a virtual experience in accordance with some embodiments.

Further, the spatial relationship between the display device 206 and the user 204 may include at least one of a distance 218 and an orientation. Further, the disturbance in the spatial relationship between the display device 206 and the user 204 may include a change in at least one of the distance 218, the angle, the direction, and the orientation. Further, the distance 218 may include a perceived distance between the user 204 and the at least one display data. For instance, as shown in FIG. 3, the disturbance in the spatial relationship may originate due to a forward acceleration 304 of the user 204 and the wearable display device 200. Accordingly, the deformation of the deformable layer 216 may lead to a disturbance in the spatial relationship leading to a change in the distance 218 to a reduced distance 302 between the display device 206 and the user 204. Accordingly, the correction data may include transforming of the at least one display data through object level processing and restoring the at least one display data to the distance 218 from the user 204. Further, the object level processing may include projecting one or more objects in the display data at the distance 218 instead of the distance 302 to oppose the disturbance in the spatial relationship. Further, the disturbance in the spatial relationship may include a change in the angle between the display device 206 and the user 204. Further, the angle between the display device 206 and the user 204 in the spatial relationship may be related to an original viewing angle related to the display data. Further, the original viewing angle related to the display data may be a viewing angle at which the user 204 may view the display data through the display device 206. Further, the disturbance in the spatial relationship may lead to a change in the original viewing angle related to the display data. Accordingly, the at least one display data may be transformed through pixel level processing to restore the original viewing angle related to the display data. Further, the pixel level processing may include translation of the display data to compensate for the change in the angle in the spatial relationship. Further, the display data may be translated along a horizontal axis of the display data, a vertical axis of the display data, a diagonal axis of the display data, and so on, to negate the angular displacement of the display data to compensate for the change in the angle in the spatial relationship, and to restore the original viewing angle related to the display data.

FIG. 3 is a block diagram of a system 300 for facilitating provisioning of a virtual experience in accordance with some embodiments. The system 300 may include a communication device 302, a processing device 304 and a storage device 306.

The communication device 302 may be configured for receiving at least one first sensor data corresponding to at least one first sensor 310 associated with a first vehicle 308. Further, the at least one first sensor 310 may be communicatively coupled to a first transmitter 312 configured for transmitting the at least one first sensor data over a first communication channel. In some embodiments, the first vehicle 308 may be a first aircraft. Further, the first user may be a first pilot.

Further, the communication device 302 may be configured for receiving at least one second sensor data corresponding to at least one second sensor 320 associated with a second vehicle 318. Further, the at least one second sensor 320 may be communicatively coupled to a second transmitter 322 configured for transmitting the at least one second sensor data over a second communication channel. In some embodiments, the second vehicle 818 may be a second aircraft. Further, the second user may be a second pilot.

In some embodiments, the at least one first sensor data may be received from a first On-Board-Diagnostics (OBD) system of the first vehicle 308, the at least one second sensor data may be received from a second On-Board-Diagnostics (OBD) system of the second vehicle 318.

Further, the communication device 302 may be configured for receiving at least one first presentation sensor data from at least one first presentation sensor 328 associated with the first vehicle 308. Further, the at least one first presentation sensor 328 may be communicatively coupled to the first transmitter configured for transmitting the at least one first presentation sensor data over the first communication channel. Further, in an embodiment, the at least one first presentation sensor 328 may include a disturbance sensor, such as the disturbance sensor 208 configured for sensing a disturbance in a first spatial relationship between at least one first presentation device 314 associated with the first vehicle 308, and the first user. Further, the spatial relationship between the at least one first presentation device 314 and the first user may include at least one of a distance and an orientation. For instance, the first spatial relationship may include an exact distance, and an orientation, such as a precise angle between the at least one first presentation device 314 and the eyes of the first user. Further, the disturbance in the first spatial relationship may include a change in the at least of the distance and the orientation between the at least one first presentation device 314 and the first user.

Further, the communication device 302 may be configured for receiving at least one second presentation sensor data from at least one second presentation sensor 330 associated with the second vehicle 318.

Further, in an embodiment, the at least one second presentation sensor 330 may include a disturbance sensor configured for sensing a disturbance in a second spatial relationship between at least one second presentation device 324 associated with the second vehicle 318, and the second user.

Further, the at least one second presentation sensor 330 may be communicatively coupled to the first transmitter configured for transmitting the at least one second presentation sensor data over the second communication channel.

Further, the communication device 302 may be configured for transmitting at least one first optimized presentation data to at least one first presentation device 314 associated with the first vehicle 808. Further, in an embodiment, at least one first presentation device 314 may include a wearable display device facilitating provisioning of a virtual experience, such as the wearable display device 200. Further, in an embodiment, the at least one first optimized presentation data may include a first corrected display data generated based on a first correction data.

Further, the at least one first presentation device 314 may include a first receiver 316 configured for receiving the at least one first optimized presentation data over the first communication channel. Further, the at least one first presentation device 314 may be configured for presenting the at least one first optimized presentation data.

Further, the communication device 302 may be configured for transmitting at least one second optimized presentation data to at least one first presentation device 314 associated with the first vehicle 308. Further, the first receiver 316 may be configured for receiving the at least one second optimized presentation data over the first communication channel. Further, the at least one first presentation device 314 may be configured for presenting the at least one second optimized presentation data.

Further, in an embodiment, the at least one second optimized presentation data may include a second corrected display data generated based on a second correction data.

Further, the communication device 302 may be configured for transmitting at least one second optimized presentation data to at least one second presentation device 324 associated with the second vehicle 318. Further, the at least one second presentation device 324 may include a second receiver 326 configured for receiving the at least one second optimized presentation data over the second communication channel. Further, the at least one first presentation device 324 may be configured for presenting the at least one second optimized presentation data.

Further, the processing device 304 may be configured for analyzing the at least one first presentation sensor data associated with the first vehicle 308.

Further, the processing device 304 may be configured for analyzing the at least one second presentation sensor data associated with the second vehicle 318.

Further, the processing device 304 may be configured for generating the first correction data based on the analyzing the at least one first presentation sensor data associated with the first vehicle 308. Further, the first correction data may include an instruction to shift a perspective view of the at least one first optimized presentation data to compensate for the disturbance in the first spatial relationship between the first presentation device 314 and the first user. Accordingly, the first correction data may be generated contrary to the disturbance in the first spatial relationship. For instance, the disturbance may include an angular disturbance, wherein the first presentation device 314 may undergo an angular displacement as a result of the angular disturbance. Accordingly, the first correction data may include an instruction of translation to generate the first corrected display data included in the first optimized presentation data to compensate for the angular disturbance.

Further, the processing device 304 may be configured for generating the second correction data based on the analyzing the at least one second presentation sensor data associated with the second vehicle 318. Further, the second correction data may include an instruction to shift a perspective view of the at least one second optimized presentation data to compensate for the disturbance in the second spatial relationship between the second presentation device 324 and the second user. Accordingly, the second correction data may be generated contrary to the disturbance in the second spatial relationship. For instance, the disturbance may include an angular disturbance, wherein the second presentation device 324 may undergo an angular displacement as a result of the angular disturbance. Accordingly, the second correction data may include an instruction of translation to generate the second corrected display data included in the second optimized presentation data to compensate for the angular disturbance.

Further, the processing device 304 may be configured for generating the at least one first optimized presentation data based on the at least one second sensor data.

Further, the processing device 304 may be configured for generating the at least one first optimized presentation data based on the at least one first presentation sensor data.

Further, the processing device 304 may be configured for generating the at least one second optimized presentation data based on the at least one first sensor data.

Further, the processing device 304 may be configured for generating the at least one second optimized presentation data based on the at least one second presentation sensor data.

Further, the storage device 306 may be configured for storing each of the at least one first optimized presentation data and the at least one second optimized presentation data.

In some embodiments, the at least one first sensor 310 may include one or more of a first orientation sensor, a first motion sensor, a first accelerometer, a first location sensor, a first speed sensor, a first vibration sensor, a first temperature sensor, a first light sensor and a first sound sensor. Further, the at least one second sensor 320 may include one or more of a second orientation sensor, a second motion sensor, a second accelerometer, a second location sensor, a second speed sensor, a second vibration sensor, a second temperature sensor, a second light sensor and a second sound sensor.

In some embodiments, the at least one first sensor 310 may be configured for sensing at least one first physical variable associated with the first vehicle 308. Further, the at least one second sensor 320 may be configured for sensing at least one second physical variable associated with the second vehicle 318. In further embodiments, the at least one first physical variable may include one or more of a first orientation, a first motion, a first acceleration, a first location, a first speed, a first vibration, a first temperature, a first light intensity and a first sound. Further, the at least one second physical variable may include one or more of a second orientation, a second motion, a second acceleration, a second location, a second speed, a second vibration, a second temperature, a second light intensity and a second sound.

In some embodiments, the at least one first sensor 310 may include a first environmental sensor configured for sensing a first environmental variable associated with the first vehicle 308. Further, the at least one second sensor 320 may include a second environmental sensor configured for sensing a second environmental variable associated with the second vehicle 318.

In some embodiments, the at least one first sensor 310 may include a first user sensor configured for sensing a first user variable associated with a first user of the first vehicle 308. Further, the at least one second sensor 320 may include a second user sensor configured for sensing a second user variable associated with a second user of the second vehicle 318.

In further embodiments, the first user variable may include a first user location and a first user orientation. Further, the second user variable may include a second user location and a second user orientation. Further, the first presentation device may include a first head mount display. Further, the second presentation device may include a second head mount display.

In further embodiments, the first head mount display may include a first user location sensor of the at least one first sensor 310 configured for sensing the first user location and a first user orientation sensor of the at least one first sensor 310 configured for sensing the first user orientation. Further, the second head mount display may include a second user location sensor of the at least one second sensor 320 configured for sensing the second user location, a second user orientation sensor of the at least one second sensor 320 configured for sensing the second user orientation.

In further embodiments, the first vehicle 308 may include a first user location sensor of the at least one first sensor 310 configured for sensing the first user location and a first user orientation sensor of the at least one first sensor 310 configured for sensing the first user orientation. Further, the second vehicle 318 may include a second user location sensor of the at least one second sensor 320 configured for sensing the second user location, a second user orientation sensor of the at least one second sensor 320 configured for sensing the second user orientation.

In further embodiments, the first user orientation sensor may include a first gaze sensor configured for sensing a first eye gaze of the first user. Further, the second user orientation sensor may include a second gaze sensor configured for sensing a second eye gaze of the second user.

In further embodiments, the first user location sensor may include a first proximity sensor configured for sensing the first user location in relation to the at least one first presentation device 314. Further, the second user location sensor may include a second proximity sensor configured for sensing the second user location in relation to the at least one second presentation device 324.

Further, in some embodiments, the at least one first presentation sensor 328 may include at least one sensor configured for sensing at least one first physical variable associated with the first presentation device 314 associated with the first vehicle 308, such as due to a G-Force, a frictional force, and an uneven movement of the first vehicle 308. For instance, the at least one first presentation sensor 328 may include at least one camera configured to monitor a movement of the first presentation device 314 associated with the first vehicle 308. Further, the at least one first presentation sensor 328 may include at least one accelerometer sensor configured to monitor an uneven movement of the first presentation device 314 associated with the first vehicle 308, such as due to a G-Force, a frictional force, and an uneven movement of the first vehicle 308. Further, the at least one first presentation sensor 328 may include at least one gyroscope sensor configured to monitor an uneven orientation of the first presentation device 314 associated with the first vehicle 308, such as due to a G-Force, a frictional force, and an uneven movement of the first vehicle 308.

Further, the at least one second presentation sensor 330 may include at least one sensor configured for sensing at least one first physical variable associated with the second presentation device 324 associated with the second vehicle 318, such as due to a G-Force, a frictional force, and an uneven movement of the second vehicle 318. For instance, the at least one second presentation sensor 330 may include at least one camera configured to monitor a movement of the second presentation device 324 associated with the second vehicle 318. Further, the at least one second presentation sensor 330 may include at least one accelerometer sensor configured to monitor an uneven movement of the second presentation device 324 associated with the second vehicle 318, such as due to a G-Force, a frictional force, and an uneven movement of the second vehicle 318. Further, the at least one second presentation sensor 330 may include at least one gyroscope sensor configured to monitor an uneven orientation of the second presentation device 324 associated with the second vehicle 318, such as due to a G-Force, a frictional force, and an uneven movement of the second vehicle 318.

In some embodiments, the first head mount display may include a first see-through display device. Further, the second head mount display may include a second see-through display device.

In some embodiments, the first head mount display may include a first optical marker configured to facilitate determination of one or more of the first user location and the first user orientation. Further, the at least one first sensor 310 may include a first camera configured for capturing a first image of the first optical marker. Further, the at least one first sensor 310 may be communicatively coupled to a first processor associated with the vehicle. Further, the first processor may be configured for determining one or more of the first user location and the first user orientation based on analysis of the first image. Further, the second head mount display may include a second optical marker configured to facilitate determination of one or more of the second user location and the second user orientation. Further, the at least one second sensor 320 may include a second camera configured for capturing a second image of the second optical marker. Further, the at least one second sensor 320 may be communicatively coupled to a second processor associated with the vehicle. Further, the second processor may be configured for determining one or more of the second user location and the second user orientation based on analysis of the second image.

In some embodiments, the first presentation device may include a first see-through display device disposed in a first windshield of the first vehicle 308. Further, the second presentation device may include a second see-through display device disposed in a second windshield of the second vehicle 318.

In some embodiments, the first vehicle 308 may include a first watercraft, a first land vehicle, a first aircraft and a first amphibious vehicle. Further, the second vehicle 318 may include a second watercraft, a second land vehicle, a second aircraft and a second amphibious vehicle.

In some embodiments, the at least one may include one or more of a first visual data, a first audio data and a first haptic data. Further, the at least one second optimized presentation data may include one or more of a second visual data, a second audio data and a second haptic data.

In some embodiments, the at least one first presentation device 314 may include at least one environmental variable actuator configured for controlling at least one first environmental variable associated with the first vehicle 308 based on the first optimized presentation data. Further, the at least one second presentation device 324 may include at least one environmental variable actuator configured for controlling at least one second environmental variable associated with the second vehicle 318 based on the second optimized presentation data. In further embodiments, the at least one first environmental variable may include one or more of a first temperature level, a first humidity level, a first pressure level, a first oxygen level, a first ambient light, a first ambient sound, a first vibration level, a first turbulence, a first motion, a first speed, a first orientation and a first acceleration, the at least one second environmental variable may include one or more of a second temperature level, a second humidity level, a second pressure level, a second oxygen level, a second ambient light, a second ambient sound, a second vibration level, a second turbulence, a second motion, a second speed, a second orientation and a second acceleration.

In some embodiments, the first vehicle 308 may include each of the at least one first sensor 310 and the at least one first presentation device 314. Further, the second vehicle 318 may include each of the at least one second sensor 320 and the at least one second presentation device 324.

In some embodiments, the storage device 306 may be further configured for storing a first three-dimensional model corresponding to the first vehicle 308 and a second three-dimensional model corresponding to the second vehicle 318. Further, the generating of the first optimized presentation data may be based further on the second three-dimensional model. Further, the generating of the second optimized presentation data may be based further on the first three-dimensional model.

Further, the generating of the first optimized presentation data may be based on the determining of the unwanted movement of the associated with the first presentation device 314 associated with the first vehicle 308, such as due to a G-Force, a frictional force, and an uneven movement of the first vehicle 308. For instance, the at least one first presentation sensor 328 may include at least one camera configured to monitor a movement of the first presentation device 314 associated with the first vehicle 308. Further, the at least one first presentation sensor 328 may include at least one accelerometer sensor configured to monitor an uneven movement of the first presentation device 314 associated with the first vehicle 308, such as due to a G-Force, a frictional force, and an uneven movement of the first vehicle 308. Further, the at least one first presentation sensor 328 may include at least one gyroscope sensor configured to monitor an uneven orientation of the first presentation device 314 associated with the first vehicle 308, such as due to a G-Force, a frictional force, and an uneven movement of the first vehicle 308.

Further, the generating of the second optimized presentation data may be based on the determining of the unwanted movement of the second presentation device 324 associated with the second vehicle 318, such as due to a G-Force, a frictional force, and an uneven movement of the second vehicle 318. For instance, the at least one second presentation sensor 330 may include at least one camera configured to monitor a movement of the second presentation device 324 associated with the second vehicle 318. Further, the at least one second presentation sensor 330 may include at least one accelerometer sensor configured to monitor an uneven movement of the second presentation device 324 associated with the second vehicle 318, such as due to a G-Force, a frictional force, and an uneven movement of the second vehicle 318. Further, the at least one second presentation sensor 330 may include at least one gyroscope sensor configured to monitor an uneven orientation of the second presentation device 324 associated with the second vehicle 318, such as due to a G-Force, a frictional force, and an uneven movement of the second vehicle 318.

In some embodiments, the communication device 302 may be further configured for receiving an administrator command from an administrator device. Further, the generating of one or more of the first optimized presentation data and the second optimized presentation data may be based further on the administrator command. In further embodiments, the at least one first presentation model may include at least one first virtual object model corresponding to at least one first virtual object. Further, the at least one second presentation model may include at least one second virtual object model corresponding to at least one second virtual object. Further, the generating of the at least one first virtual object model may be independent of the at least one second sensor model. Further, the generating of the at least one second virtual object model may be independent of the at least one first sensor model. Further, the generating of one or more of the at least one first virtual object model and the at least one second virtual object model may be based on the administrator command. Further, the storage device 806 may be configured for storing the at least one first virtual object model and the at least one second virtual object model.

In further embodiments, the administrator command may include a virtual distance parameter. Further, the generating of each of the at least one first optimized presentation data and the at least one second optimized presentation data may be based on the virtual distance parameter.

In further embodiments, the at least one first sensor data may include at least one first proximity data corresponding to at least one first external real object in a vicinity of the first vehicle 308. Further, the at least one second sensor data may include at least one second proximity data corresponding to at least one second external real object in a vicinity of the second vehicle 318. Further, the generating of the at least one first optimized presentation data may be based further on the at least one second proximity data. Further, the generating of the at least one second optimized presentation data may be based further on the at least one first proximity data. In further embodiments, the at least one first external real object may include a first cloud, a first landscape feature, a first man-made structure and a first natural object. Further, the at least one second external real object may include a second cloud, a second landscape feature, a second man-made structure and a second natural object.

In some embodiments, the at least one first sensor data may include at least one first image data corresponding to at least one first external real object in a vicinity of the first vehicle 308. Further, the at least one second sensor data may include at least one second image data corresponding to at least one second external real object in a vicinity of the second vehicle 318. Further, the generating of the at least one first optimized presentation data may be based further on the at least one second image data. Further, the generating of the at least one second optimized presentation data may be based further on the at least one first image data.

In some embodiments, the communication device 302 may be further configured for transmitting a server authentication data to the first receiver 316. Further, the first receiver 316 may be communicatively coupled to first processor associated with the first presentation device. Further, the first processor may be communicatively coupled to a first memory device configured to store a first authentication data. Further, the first processor may be configured for performing a first server authentication based on the first authentication data and the server authentication data. Further, the first processor may be configured for controlling presentation of the at least one first optimized presentation data on the at least one first presentation device 314 based on the first server authentication. Further, the communication device 302 may be configured for transmitting a server authentication data to the second receiver 326. Further, the second receiver 326 may be communicatively coupled to second processor associated with the second presentation device. Further, the second processor may be communicatively coupled to a second memory device configured to store a second authentication data. Further, the second processor may be configured for performing a second server authentication based on the second authentication data and the server authentication data. Further, the second processor may be configured for controlling presentation of the at least one second optimized presentation data on the at least one second presentation device 324 based on the second server authentication. Further, the communication device 302 may be configured for receiving a first client authentication data from the first transmitter 312. Further, the storage device 306 may be configured for storing the first authentication data. Further, the communication device 302 may be configured for and receiving a second client authentication data from the second transmitter 322. Further, the storage device 306 may be configured for storing the second authentication data. Further, the processing device 304 may be further configured for performing a first client authentication based on the first client authentication data and the first authentication data. Further, the generating of the at least one second optimized presentation data may be further based on the first client authentication. Further, the processing device 304 may be configured for performing a second client authentication based on the second client authentication data and the second authentication data. Further, the generating of the at least one first optimized presentation data may be further based on the second client authentication.

Figure 4:
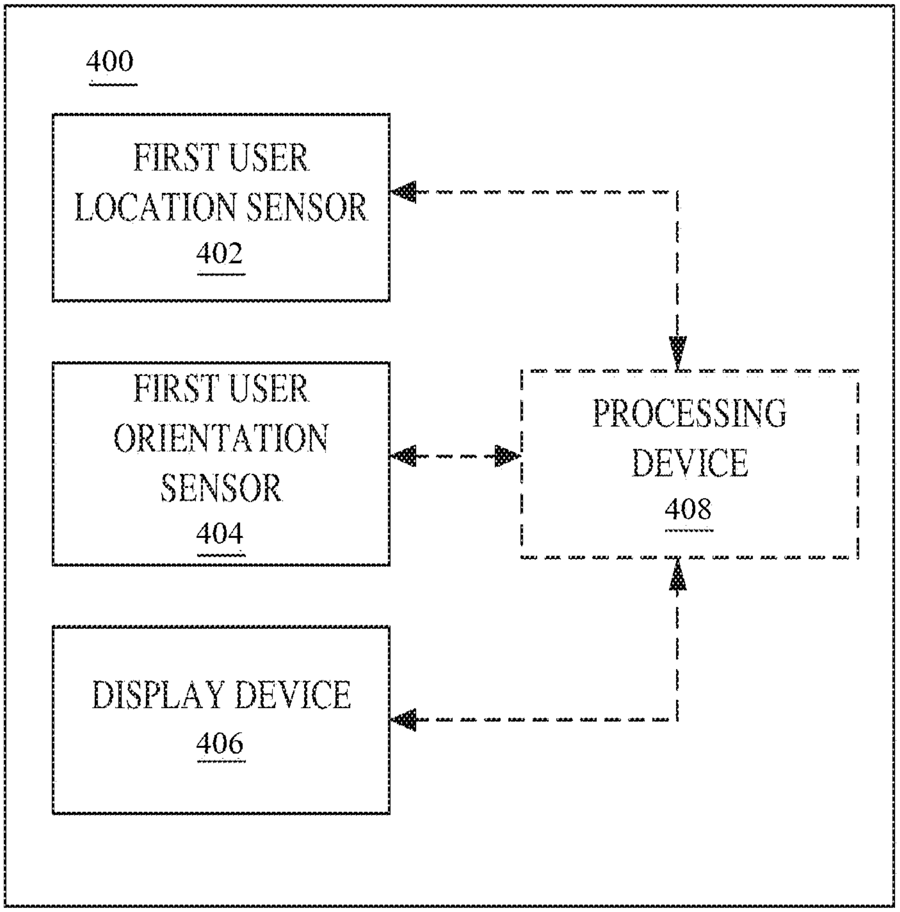
FIG. 4 is a block diagram of a first head mount display for facilitating provisioning of a virtual experience in accordance with some embodiments.

FIG. 4 is a block diagram of a first head mount display 400 for facilitating provisioning of a virtual experience in accordance with some embodiments. The first head mount display 400 may include a first user location sensor 402 of the at least one first sensor configured for sensing the first user location and a first user orientation sensor 404 of the at least one first sensor configured for sensing the first user orientation.

Further, the first head mount display 400 may include a display device 406 to present visuals. Further, in an embodiment, the display device 406 may be configured for displaying the first optimized display data, as generated by the processing device 404.

Further, the first head mount display 400 may include a processing device 408 configured to obtain sensor data from the first user location sensor 402 and the first user orientation sensor 404. Further, the processing device 408 may be configured to send visuals to the display device 406.

Figure 5:
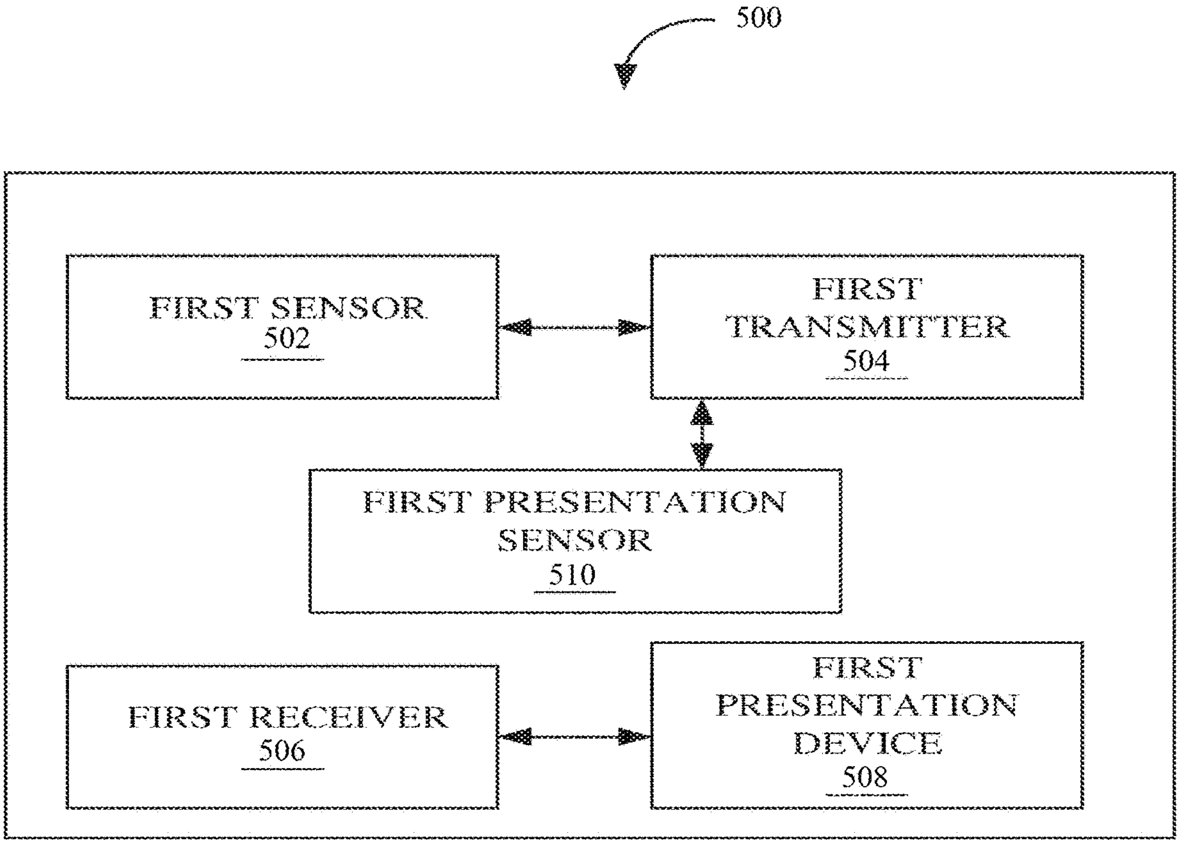
FIG. 5 is a block diagram of an apparatus for facilitating provisioning of a virtual experience in accordance with some embodiments.

FIG. 5 is a block diagram of an apparatus 500 for facilitating provisioning of a virtual experience in accordance with some embodiments. The apparatus 500 may include at least one first sensor 502 (such as the at least one first sensor 310) configured for sensing at least one first sensor data associated with a first vehicle (such as the first vehicle 308).

Further, the apparatus 500 may include at least one first presentation sensor 510 (such as the at least one first presentation sensor 328) configured for sensing at least one first presentation sensor data associated with a first vehicle (such as the first vehicle 308). Further, in an embodiment, the at least one first presentation sensor 510 may include a disturbance sensor, such as the disturbance sensor 208 configured for sensing a disturbance in a first spatial relationship between at least one first presentation device 508 associated with the first vehicle, and a first user. Further, the spatial relationship between the at least one first presentation device 508 and the first user may include at least one of a distance and an orientation. For instance, the first spatial relationship may include an exact distance, and an orientation, such as a precise angle between the at least one first presentation device 508 and the eyes of the first user. Further, the disturbance in the first spatial relationship may include a change in the at least of the distance and the orientation between the at least one first presentation device 314 and the first user.

Further, the apparatus 500 may include a first transmitter 504 (such as the first transmitter 312) configured to be communicatively coupled to the at least first sensor 502, and the at least one first presentation sensor 510. Further, the first transmitter 504 may be configured for transmitting the at least one first sensor data and the at least one first presentation sensor data to a communication device (such as the communication device 302) of a system over a first communication channel.

Further, the apparatus 500 may include a first receiver 506 (such as the first receiver 316) configured for receiving the at least one first optimized presentation data from the communication device over the first communication channel.

Further, the apparatus 500 may include the at least one first presentation device 508 (such as the at least one first presentation device 314) configured to be communicatively coupled to the first receiver 506. The at least one first presentation device 508 may be configured for presenting the at last one first optimized presentation data.

Further, the communication device may be configured for receiving at least one second sensor data corresponding to at least one second sensor (such as the at least one second sensor 320) associated with a second vehicle (such as the second vehicle 318). Further, the at least one second sensor may be communicatively coupled to a second transmitter (such as the second transmitter 322) configured for transmitting the at least one second sensor data over a second communication channel. Further, the system may include a processing device (such as the processing device 304) communicatively coupled to the communication device. Further, the processing device may be configured for generating the at least one first optimized presentation data based on the at least one second sensor data.

Figure 6:
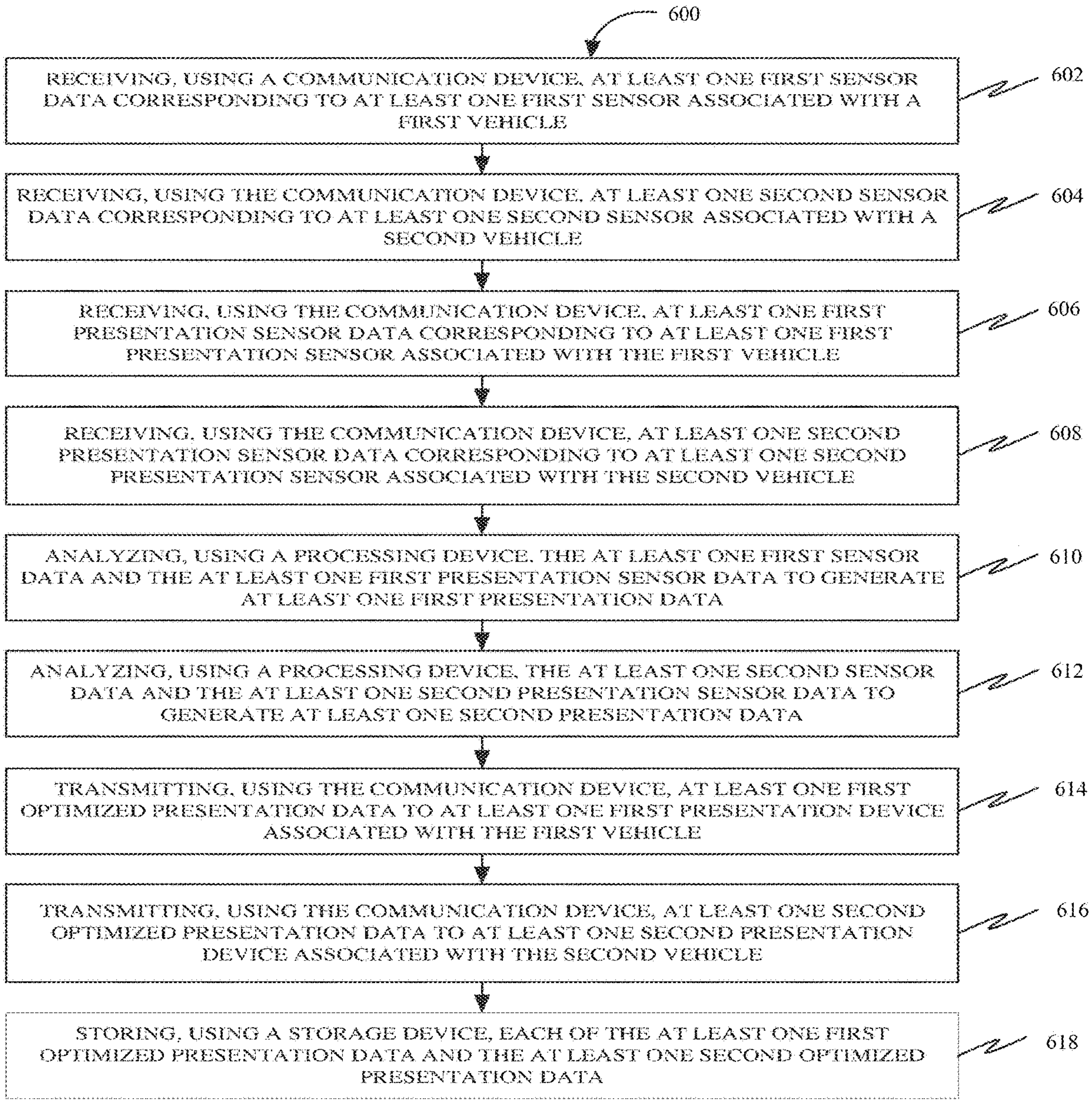
FIG. 6 is a flowchart of a method of facilitating provisioning of a virtual experience in accordance with some embodiments.

FIG. 6 is a flowchart of a method 600 of facilitating provisioning of a virtual experience in accordance with some embodiments. At 602, the method 600 may include receiving, using a communication device (such as the communication device 302), at least one first sensor data corresponding to at least one first sensor (such as the at least one first sensor 310) associated with a first vehicle (such as the first vehicle 308). Further, the at least one first sensor may be communicatively coupled to a first transmitter (such as the first transmitter 312) configured for transmitting the at least one first sensor data over a first communication channel.

At 604, the method 600 may include receiving, using the communication device, at least one second sensor data corresponding to at least one second sensor (such as the at least one second sensor 320) associated with a second vehicle (such as the second vehicle 318). Further, the at least one second sensor may be communicatively coupled to a second transmitter (such as the second transmitter 322) configured for transmitting the at least one second sensor data over a second communication channel.

At 606, the method 600 may include receiving, using the communication device, a first presentation sensor data corresponding to at least one first presentation sensor 328 associated with the first vehicle. Further, the at least one first presentation sensor may be communicatively coupled to the first transmitter configured for transmitting the at least one first presentation sensor data over the first communication channel. Further, the first presentation sensor may include at least one sensor configured to monitor a movement of at least one first presentation device associated with the first vehicle, such as due to a G-Force, a frictional force, and an uneven movement of the first vehicle. For instance, the at least one first presentation sensor may include at least one camera configured to monitor a movement of the at least one first presentation device associated with the first vehicle. Further, the at least one first presentation sensor may include at least one accelerometer sensor configured to monitor an uneven movement of the at least one first presentation device associated with the first vehicle, such as due to a G-Force, a frictional force, and an uneven movement of the first vehicle. Further, the at least one first presentation sensor may include at least one gyroscope sensor configured to monitor an uneven orientation of the at least one first presentation device associated with the first vehicle, such as due to a G-Force, a frictional force, and an uneven movement of the first vehicle.

At 608, the method 600 may include receiving, using the communication device, a second presentation sensor data corresponding to at least one second presentation sensor 330 associated with the second vehicle. Further, the at least one second presentation sensor may be communicatively coupled to the second transmitter configured for transmitting the at least one second presentation sensor data over the second communication channel. Further, the second presentation sensor may include at least one sensor configured to monitor a movement of at least one second presentation device associated with the second vehicle, such as due to a G-Force, a frictional force, and an uneven movement of the second vehicle. For instance, the at least one second presentation sensor may include at least one camera configured to monitor a movement of the at least one second presentation device associated with the second vehicle. Further, the at least one second presentation sensor may include at least one accelerometer sensor configured to monitor an uneven movement of the at least one second presentation device associated with the second vehicle, such as due to a G-Force, a frictional force, and an uneven movement of the second vehicle. Further, the at least one second presentation sensor may include at least one gyroscope sensor configured to monitor an uneven orientation of the at least one second presentation device associated with the second vehicle, such as due to a G-Force, a frictional force, and an uneven movement of the second vehicle.

At 610, the method 600 may include analyzing, using a processing device, the at least one first sensor data and the at least one first presentation sensor data to generate at least one first modified presentation data. The analyzing may include determining an unwanted movement of the at least one first presentation device associated with the first vehicle, such as due to a G-Force, a frictional force, and an uneven movement of the first vehicle. Further, the unwanted movement of the at least one first presentation device associated with the first vehicle may include an upward movement, a downward movement, a leftward movement, and a rightward movement. Further, the generating of the at least one first optimized presentation data may be based on the unwanted movement of the at least one first presentation device associated with the first vehicle, such as due to a G-Force, a frictional force, and an uneven movement of the first vehicle. For instance, the generating of the at least one first optimized presentation data may be based on negating an effect of the unwanted movement of the at least one first presentation device associated with the first vehicle. For instance, if the unwanted movement of the at least one first presentation device associated with the first vehicle includes an upward movement, a downward movement, a leftward movement, and a rightward movement, the generating of the at least one first optimized presentation data may include moving one or more components of the at least one first modified presentation data in an oppositely downward direction, an upward direction, a rightward direction, and a leftward direction respectively.

At 612, the method 600 may include analyzing, using a processing device, the at least one second sensor data and the at least one second presentation sensor data to generate at least one second presentation data. The analyzing may include determining an unwanted movement of the at least one second presentation device associated with the second vehicle, such as due to a G-Force, a frictional force, and an uneven movement of the second vehicle. Further, the unwanted movement of the at least one second presentation device associated with the second vehicle may include an upward movement, a downward movement, a leftward movement, and a rightward movement. Further, the generating of the at least one second optimized presentation data may be based on the unwanted movement of the at least one second presentation device associated with the second vehicle, such as due to a G-Force, a frictional force, and an uneven movement of the second vehicle. For instance, the generating of the at least one second optimized presentation data may be based on negating an effect of the unwanted movement of the at least one second presentation device associated with the second vehicle. For instance, if the unwanted movement of the at least one second presentation device associated with the second vehicle includes an upward movement, a downward movement, a leftward movement, and a rightward movement, the generating of the at least one second optimized presentation data may include moving one or more components of the at least one second presentation data in an oppositely downward direction, an upward direction, a rightward direction, and a leftward direction respectively.

At 614, the method 600 may include transmitting, using the communication device, at least one first optimized presentation data to at least one first presentation device associated with the first vehicle. Further, the at least one first presentation device may include a first receiver (such as the first receiver 316) configured for receiving the at least one first modified presentation data over the first communication channel. Further, the at least one presentation device may be configured for presenting the at least one first optimized presentation data.

At 616, the method 600 may include transmitting, using the communication device, at least one second optimized presentation data to at least one second presentation device (such as the at least one second presentation device 324) associated with the second vehicle. Further, the at least one second presentation device may include a second receiver (such as the second receiver 326) configured for receiving the at least one second presentation data over the second communication channel. Further, the at least one presentation device may be configured for presenting the at least one second optimized presentation data.

At 618, the method 600 may include storing, using a storage device (such as the storage device 306), each of the at least one first optimized presentation data and the at least one second optimized presentation data.

Figure 7:
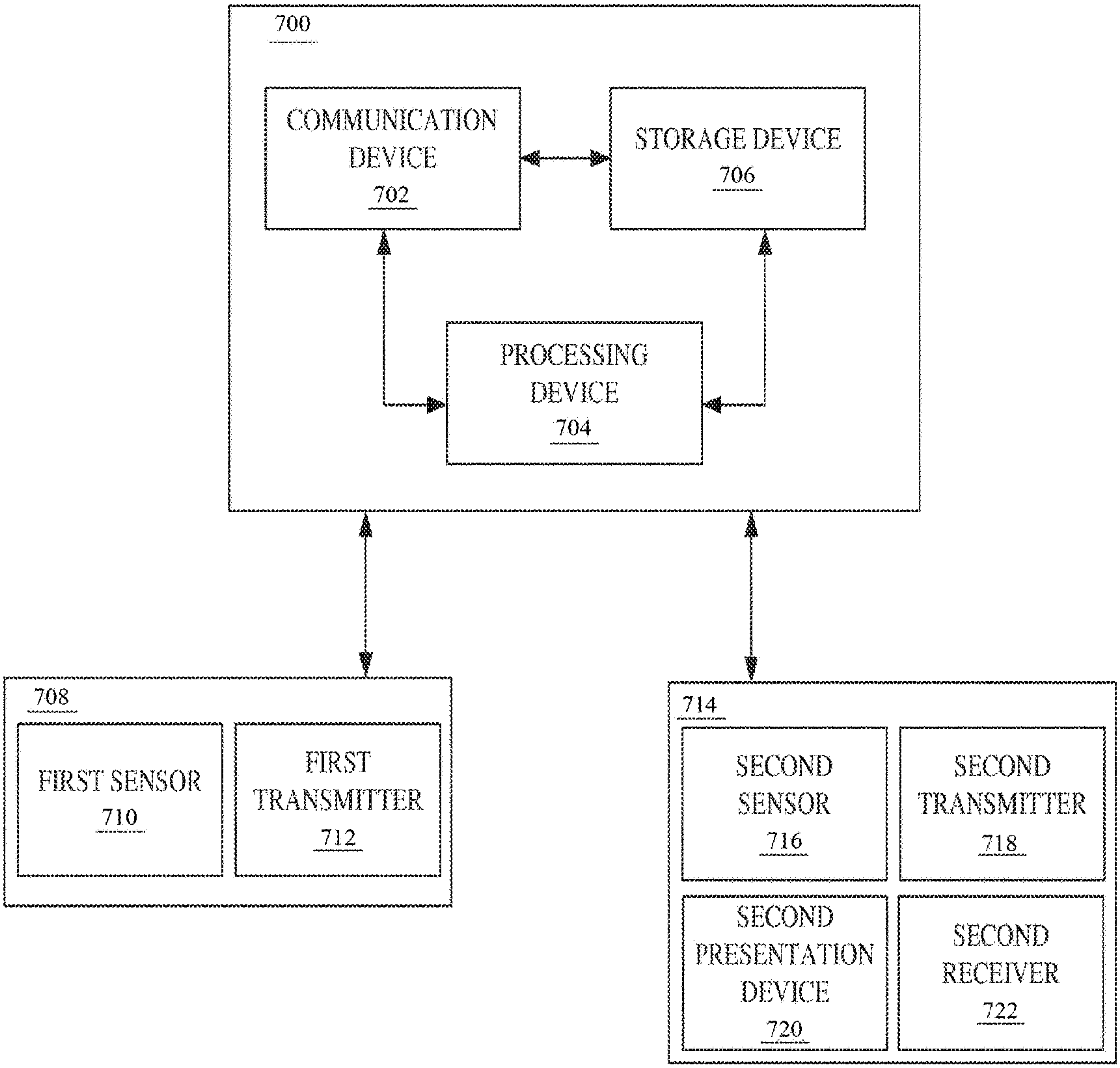
FIG. 7 shows a system for facilitating provisioning of a virtual experience, in accordance with some embodiments.

FIG. 7 shows a system 700 for facilitating provisioning of a virtual experience, in accordance with some embodiments. The system 700 may include a communication device 702 configured for receiving at least one first sensor data corresponding to at least one first sensor 710 associated with a first vehicle 708. Further, the at least one first sensor 710 may be communicatively coupled to a first transmitter 712 configured for transmitting the at least one first sensor data over a first communication channel.

Further, the communication device 702 may be configured for receiving at least one second sensor data corresponding to at least one second sensor 716 associated with a second vehicle 714. Further, the at least one second sensor 716 may include a second location sensor configured to detect a second location associated with the second vehicle 714. Further, the at least one second sensor 716 may be communicatively coupled to a second transmitter 718 configured for transmitting the at least one second sensor data over a second communication channel. Further, in some embodiments, the at least one second sensor 716 may include a second user sensor configured for sensing a second user variable associated with a second user of the second vehicle 714. Further, the second user variable may include a second user location and a second user orientation.

Further, in some embodiments, the at least one second sensor 716 may include a disturbance sensor, such as the disturbance sensor 208 configured for sensing a disturbance in a spatial relationship between a second presentation device 720 associated with the second vehicle 714 and the second user of the second vehicle 714. Further, the spatial relationship between the second presentation device 720 and the second user may include at least one of a distance and an orientation. For instance, the spatial relationship may include an exact distance, and an orientation, such as a precise angle between the second presentation device 720 and the eyes of the second user.

Further, the disturbance in the spatial relationship may include a change in the at least of the distance and the orientation between the second presentation device 720 and the second user. Further, the disturbance in the spatial relationship may lead to an alteration in how the second user may view at least one second presentation data. For instance, if the disturbance in the spatial relationship leads to a reduction in the distance between the second presentation device 720 and the second user, the second user may perceive one or more objects in the at least one second presentation data to be closer. For instance, if the spatial relationship between the second presentation device 720 and the second user specifies a distance of "x" centimeters, and the disturbance in the spatial relationship leads to a reduction in the distance between the second presentation device 720 and the second user to "y" centimeters, the second user may perceive the at least one second presentation data to be closer by "x-y" centimeters.

Further, the communication device 702 may be configured for transmitting the at least one second presentation data to the at least one second presentation device 720 associated with the second vehicle 714. Further, the at least one second presentation data may include at least one second virtual object model corresponding to at least one second virtual object. Further, in some embodiments, the at least one second virtual object may include one or more of a navigational marker and an air-corridor.

Further, in an embodiment, the at least one second presentation data may include a second corrected display data generated based on a second correction data. Further, the at least one second presentation device 720 may include a second receiver 722 configured for receiving the at least one second presentation data over the second communication channel. Further, the at least one second presentation device 720 may be configured for presenting the at least one second presentation data. Further, in some embodiments, the at least one second presentation device 720 may include a second head mount display. Further, the second head mount display may include a second user location sensor of the at least one second sensor 716 configured for sensing the second user location and a second user orientation sensor of the at least one second sensor 716 configured for sensing the second user orientation. Further, the second head mount display may include a second see-through display device.

Figure 8:
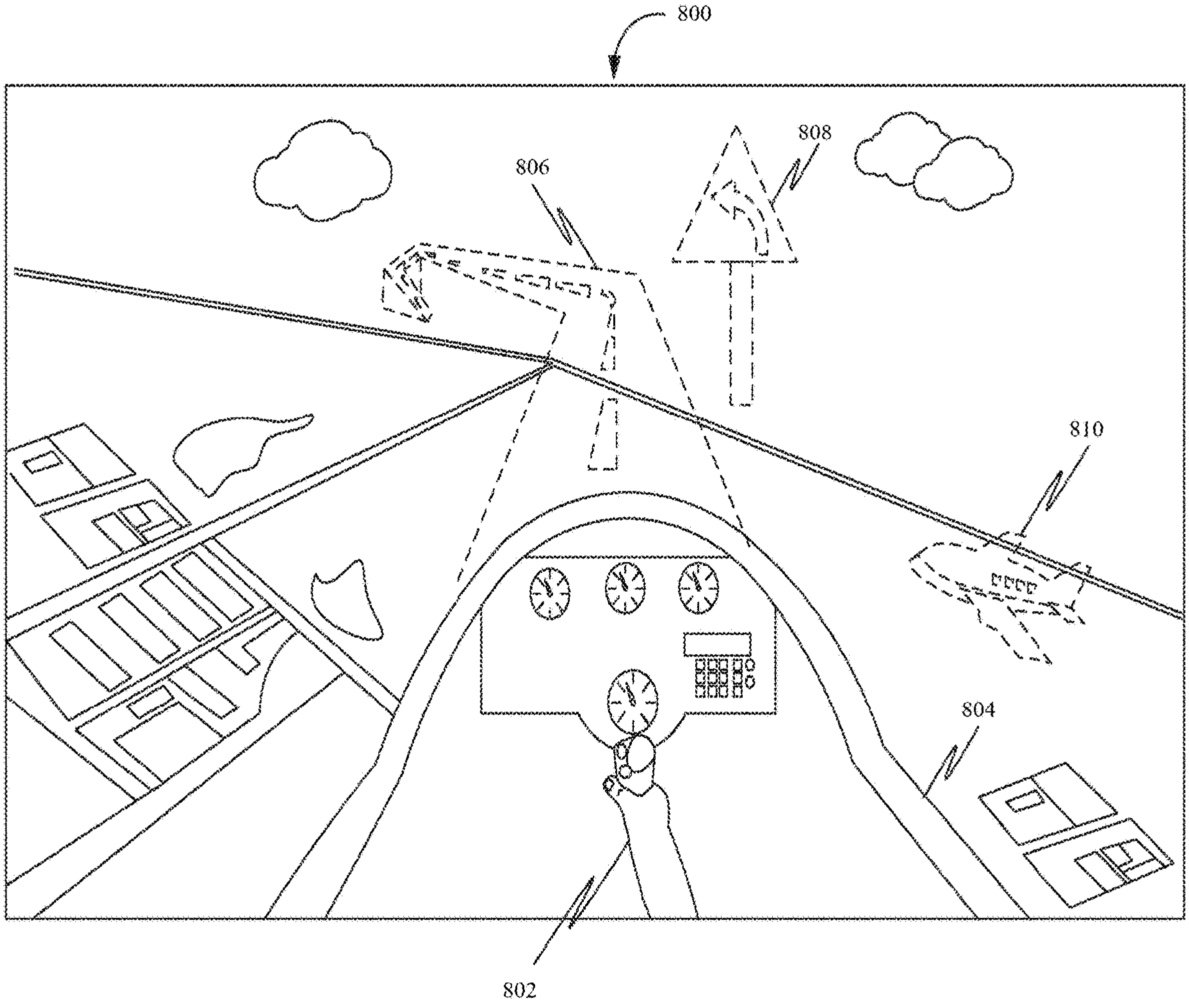
FIG. 8 shows a corrected augmented reality view, in accordance with some embodiments.

Further, in some embodiments, the at least one second virtual object model may include a corrected augmented reality view, such as the corrected augmented reality view 800. Further, the augmented reality view 800 may include one or more second virtual objects such as a navigational marker 808, and a skyway 806 as shown in FIG. 8).

Further, the system 700 may include a processing device 704 configured for generating the at least one second presentation data based on the at least one first sensor data and the at least one second sensor data. Further, the generating of the at least one second virtual object model may be independent of the at least one first sensor data. Further, in some embodiments, the processing device 704 may be configured for determining a second airspace class associated with the second vehicle 714 based on the second location including a second altitude associated with the second vehicle 714. Further, the generating of the at least one second virtual object model may be based on the second airspace class.

Further, the processing device 704 may be configured for generating the second correction data based on the analyzing the at least one second sensor data associated with the second vehicle 714. Further, the second correction data may include an instruction to shift a perspective view of the at least one second presentation data to compensate for the disturbance in the spatial relationship between the second presentation device 720 and the second user. Accordingly, the second correction data may be generated contrary to the disturbance in the spatial relationship. For instance, the disturbance may include an angular disturbance, wherein the second presentation device 720 may undergo an angular displacement as a result of the angular disturbance. Accordingly, the second correction data may include an instruction of translation to generate the second corrected display data included in the second presentation data to compensate for the angular disturbance.

For instance, if the at least one second presentation data includes the at least one second virtual object model may include a corrected augmented reality view, such as the corrected augmented reality view 800, the second correction data may include an instruction to shift a perspective view of the at least one second presentation data to compensate for the disturbance in the spatial relationship between the second presentation device 720 and the second user (such as a pilot 802). For instance, if the disturbance in the spatial relationship includes a reduction in the distance between the second presentation device 720, the second correction data may include an instruction to shift a perspective view of the at least one second presentation data to compensate for the disturbance in the spatial relationship between the second presentation device 720 and the second user, such as by projection of the one or more second virtual objects, such as the navigational marker 808, and the skyway 806 at a distance to compensate the disturbance and to generate the corrected augmented reality view 800.

Further, the system 700 may include a storage device 706 configured for storing the at least one second presentation data. Further, in some embodiments, the storage device 706 may be configured for retrieving the at least one second virtual object model based on the second location associated with the second vehicle 714. Further, in some embodiments, the storage device 706 may be configured for storing a first three-dimensional model corresponding to the first vehicle 708. Further, the generating of the second presentation data may be based on the first three-dimensional model.

Further, in some embodiments, the communication device 702 may be configured for receiving an administrator command from an administrator device. Further, the generating of the at least one second virtual object model may be based on the administrator command.

Further, in some embodiments, the communication device 702 may be configured for transmitting at least one first presentation data to at least one first presentation device (not shown) associated with the first vehicle 708. Further, the at least one first presentation device may include a first receiver configured for receiving the at least one first presentation data over the first communication channel. Further, the at least one first presentation device may be configured for presenting the at least one first presentation data. Further, in some embodiments, the processing device 704 may be configured for generating the at least one first presentation data based on the at least one second sensor data. Further, in some embodiments, the storage device 706 may be configured for storing the at least one first presentation data. Further, in some embodiments, the storage device 706 may be configured for storing a second three-dimensional model corresponding to the second vehicle 714. Further, the generating of the first presentation data may be based on the second three-dimensional model.

Further, in some embodiments, the at least one first presentation data may include at least one first virtual object model corresponding to at least one first virtual object. Further, the generating of the at least one first virtual object model may be independent of the at least one second sensor data. Further, the storage device 706 may be configured for storing the at least one first virtual object model.

Figure 9:
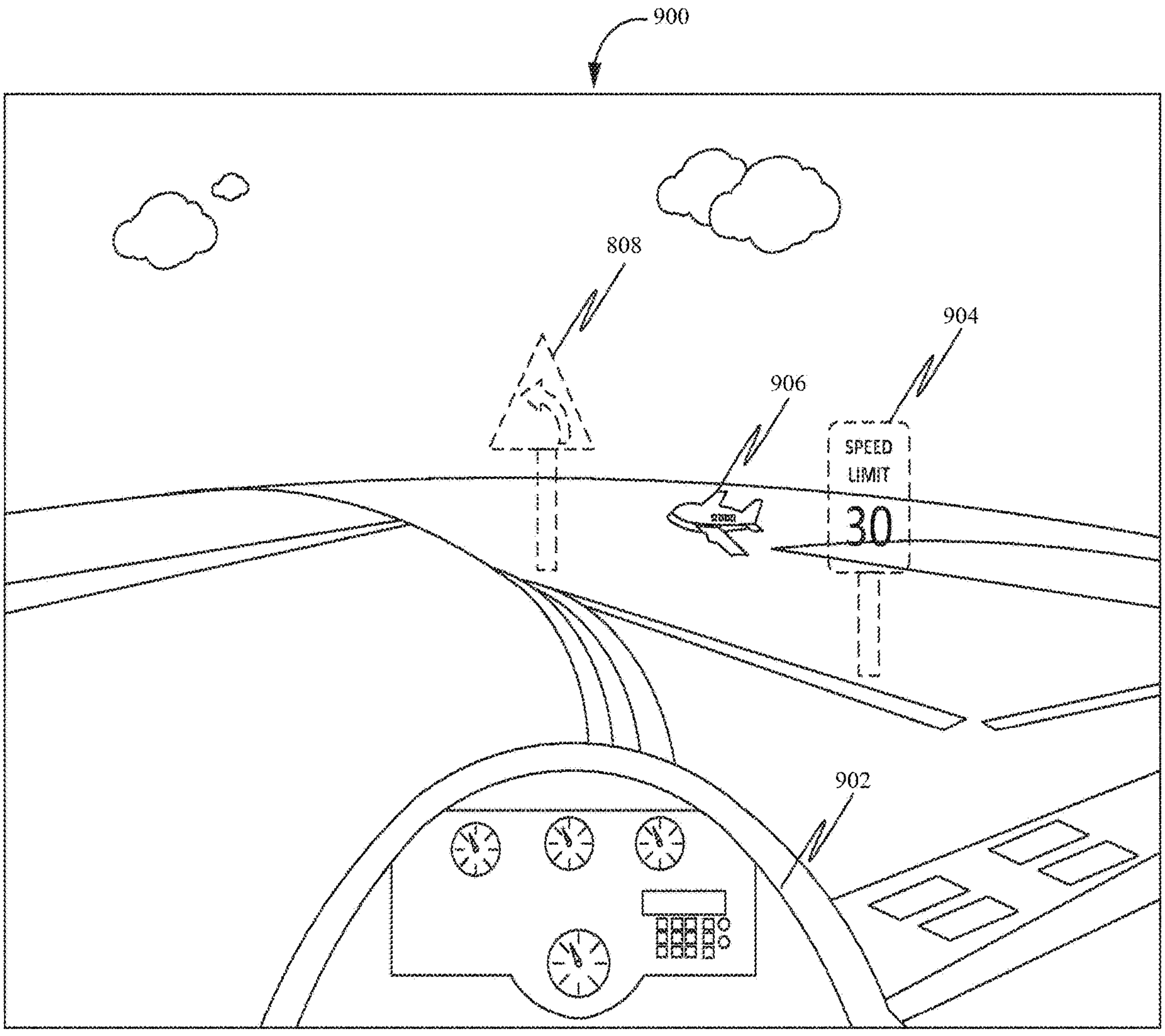
FIG. 9 shows an augmented reality view shown to a real pilot while a civilian aircraft is taxiing at an airport, in accordance with an exemplary embodiment.

Further, in some exemplary embodiment, the communication device 702 may be configured for receiving at least one second sensor data corresponding to at least one second sensor 716 associated with a second vehicle 714. Further, the at least one second sensor 716 may be communicatively coupled to a second transmitter 718 configured for transmitting the at least one second sensor data over a second communication channel. Further, the communication device 702 may be configured for receiving at least one first sensor data corresponding to at least one first sensor 710 associated with a first vehicle 708. Further, the at least one first sensor 710 may include a first location sensor configured to detect a first location associated with the first vehicle 708. Further, the at least one first sensor 710 may be communicatively coupled to a first transmitter 712 configured for transmitting the at least one first sensor data over a first communication channel. Further, in some embodiments, the at least one first sensor 710 may include a first user sensor configured for sensing a first user variable associated with a first user of the first vehicle 708. Further, the first user variable may include a first user location and a first user orientation. Further, the communication device 702 configured for transmitting at least one first presentation data to at least one first presentation device (not shown) associated with the first vehicle 708. Further, the at least one first presentation data may include at least one first virtual object model corresponding to at least one first virtual object. Further, in some embodiments, the at least one first virtual object may include one or more of a navigational marker (such as a navigational marker 708, and/or a signboard 904 as shown in FIG. 9) and an air-corridor (such as a skyway 806 as shown in FIG. 8). Further, the at least one first presentation device may include a first receiver configured for receiving the at least one first presentation data over the first communication channel. Further, the at least one first presentation device may be configured for presenting the at least one first presentation data. Further, in some embodiments, the at least one first presentation device may include a first head mount display. Further, the first head mount display may include a first user location sensor of the at least one first sensor 710 configured for sensing the first user location and a first user orientation sensor of the at least one first sensor 710 configured for sensing the first user orientation. Further, the first head mount display may include a first see-through display device. Further, the processing device 704 may be configured for generating the at least one first presentation data based on the at least one second sensor data and the at least one first sensor data. Further, the generating of the at least one first virtual object model may be independent of the at least one second sensor data. Further, in some embodiments, the processing device 704 may be configured for determining a first airspace class associated with the first vehicle 708 based on the first location including a first altitude associated with the first vehicle 708. Further, the generating of the at least one first virtual object model may be based on the first airspace class. Further, in some embodiments, the storage device 706 may be configured for storing the at least one first presentation data. Further, in some embodiments, the storage device 706 may be configured for retrieving the at least one first virtual object model based on the first location associated with the first vehicle 708. Further, in some embodiments, the storage device 706 may be configured for storing a second three-dimensional model corresponding to the second vehicle 714. Further, the generating of the first presentation data may be based on the second three-dimensional model. Further, in some embodiments, the communication device 702 may be configured for receiving an administrator command from an administrator device. Further, the generating of the at least one first virtual object model may be based on the administrator command. Further, in some embodiments, the communication device 702 may be configured for transmitting at least one second presentation data to at least one second presentation device (such as the second presentation device 720) associated with the second vehicle 714. Further, the at least one second presentation device may include a second receiver (such as the second receiver 722) configured for receiving the at least one second presentation data over the second communication channel. Further, the at least one second presentation device may be configured for presenting the at least one second presentation data. Further, in some embodiments, the processing device 704 may be configured for generating the at least one second presentation data based on the at least one first sensor data. Further, in some embodiments, the storage device 706 may be configured for storing the at least one second presentation data. Further, in some embodiments, the storage device 706 may be configured for storing a first three-dimensional model corresponding to the first vehicle 708. Further, the generating of the second presentation data may be based on the first three-dimensional model. Further, in some embodiments, the at least one second presentation data may include at least one second virtual object model corresponding to at least one second virtual object. Further, the generating of the at least one second virtual object model may be independent of the at least one first sensor data. Further, the storage device 706 may be configured for storing the at least one second virtual object model.

FIG. 8 shows the corrected augmented reality view 800. Further, the augmented reality view 800 may include a road drawn in the sky (such as the skyway 806) indicating a path that a civilian aircraft 804 may take in order to land at an airport. Further, the augmented reality view 800 may include the navigation marker 808 indicating to a pilot 802 that the civilian aircraft 804 should take a left turn. The navigation marker 808 may assist the pilot 802 in navigating towards a landing strip to land the civilian aircraft 804.

Therefore, the corrected augmented reality view 800 may provide pilots with a similar view as seen by public transport drivers (e.g. taxi or bus) on the ground. The pilots (such as the pilot 802) may see roads (such as the skyway 806) that the pilot 802 need to drive on. Further, the pilot 802, in an instance, may see signs just like a taxi driver who may just look out of a window and see road signs.

Further, the corrected augmented reality view 800 may include (but not limited to) one or more of skyways (such the skyway 806), navigation markers (such as the navigation marker 808), virtual tunnels, weather information, an air corridor, speed, signboards for precautions, airspace class, one or more parameters shown on a conventional horizontal situation indicator (HSI) etc. The skyways may indicate a path that an aircraft (such as the civilian aircraft 804) should take. The skyways may appear similar to roads on the ground. The navigation markers may be similar to regulatory road signs used on the roads on the ground. Further, the navigation markers may instruct pilots (such as the pilot 802) on what they must or should do (or not do) under a given set of circumstances. Further, the navigation markers may be used to reinforce air-traffic laws, regulations or requirements which apply either at all times or at specified times or places upon a flight path. For example, the navigation markers may include one or more of a left curve ahead sign, a right curve ahead sign, a keep left sign, and a keep to right sign. Further, the virtual tunnels may appear similar to tunnels on roads on the ground. The pilot 802 may be required to fly the aircraft through the virtual tunnel. Further, the weather information may include real-time weather data that affects flying conditions. For example, the weather information may include information related to one or more of wind speed, gust, and direction; variable wind direction; visibility, and variable visibility; temperature; precipitation; and cloud cover. Further, the air corridor may indicate an air route along which the aircraft is allowed to fly, especially when the aircraft is over a foreign country. Further, the corrected augmented reality view 800 may include speed information. The speed information may include one or more of a current speed, a ground speed, and a recommended speed. The signboards for precautions may be related to warnings shown to the pilot 802. The one or more parameters shown on a conventional horizontal situation indicator (HSI) include NAV warning flag, lubber line, compass warning flag, course select pointer, TO/FROM indicator, glideslope deviation scale, heading select knob, compass card, course deviation scale, course select knob, course deviation bar (CDI), symbolic aircraft, dual glideslope pointers, and heading select bug.

Further, in some embodiments, information such as altitude, attitude, airspeed, the rate of climb, heading, autopilot and auto-throttle engagement status, flight director modes and approach status etc. that may be displayed on a conventional primary flight display may also be displayed in the corrected augmented reality view 800.

Further, in some embodiments, the corrected augmented reality view 800 may include a one or more of other vehicles (such as another airplane 810). Further, the one or more other vehicles, in an instance, may include one or more live vehicles (such as representing real pilots flying real aircraft), one or more virtual vehicles (such as representing real people on the ground, flying virtual aircraft), and one or more constructed vehicles (such as representing aircraft generated and controlled using computer graphics and processing systems).

In some embodiments, a special use airspace class may be determined. The special use airspace class may include alert areas, warning areas, restricted areas, prohibited airspace, military operation area, national security area, controlled firing areas etc. For an instance, if an aircraft (such as the civilian aircraft 804) enters a prohibited area by mistake, then a notification may be displayed in the corrected augmented reality view 800. Accordingly, the pilot 802 may reroute the aircraft towards a permitted airspace.

Further, the corrected augmented reality view 800 may include one or more live aircraft (representing real pilots flying real aircraft), one or more virtual aircraft (representing real people on the ground, flying virtual aircraft) and one or more constructed aircraft (representing aircraft generated and controlled using computer graphics and processing systems). Further, the corrected augmented reality view 800 shown to a pilot (such as the pilot 802) in a first aircraft (such as the civilian aircraft 804) may be modified based on sensor data received from another aircraft (such as another airplane 1410). The sensor data may include data received from one or more internal sensors to track and localize the pilot's head within the cockpit of the aircraft. Further, the sensor data may include data received from one or more external sensors to track the position and orientation of the aircraft. Further, the data received from the one or more internal sensors and the one or more external sensors may be combined to provide a highly usable augmented reality solution in a fast-moving environment.

FIG. 9 shows an augmented reality view 900 shown to a real pilot while a civilian aircraft 902 is taxiing at an airport, in accordance with an exemplary embodiment. The augmented reality view 900 may include one or more navigational markers (such as the navigation marker 808) and signboards (such as a signboard 904) that assist a pilot to taxi the civilian aircraft 902 at the airport. The navigational markers may indicate the direction of movement. The signboards may indicate the speed limits.

The augmented reality view 900 may help the pilot to taxi the civilian aircraft 902 towards a parking location after landing. Further, augmented reality view 900 may help the pilot to taxi the civilian aircraft 902 towards a runway for taking-off. Therefore, a ground crew may no longer be required to instruct the pilot while taxiing the civilian aircraft 902 at the airport.

Further, the augmented reality view 900 may include one or more live aircraft (such as a live aircraft 906) at the airport (representing real pilots in real aircraft), one or more virtual aircraft at the airport (representing real people on the ground, controlling a virtual aircraft) and one or more constructed aircraft at the airport (representing aircraft generated and controlled using computer graphics and processing systems). Further, the augmented reality view 900 shown to a pilot in a first aircraft may be modified based on sensor data received from another aircraft. The sensor data may include data received from one or more internal sensors to track and localize the pilot's head within the cockpit of the aircraft. Further, the sensor data may include data received from one or more external sensors to track the position and orientation of the aircraft. Further, the data received from the one or more internal sensors and the one or more external sensors may be combined to provide a highly usable augmented reality solution in a fast-moving environment.

In accordance with exemplary and non-limiting embodiments, the process of acquiring sensor information from one or more vehicles, maintaining a repository of data describing various real and virtual platforms and environments, and generating presentation data may be distributed among various platforms and among a plurality of processors.

Figure 10:
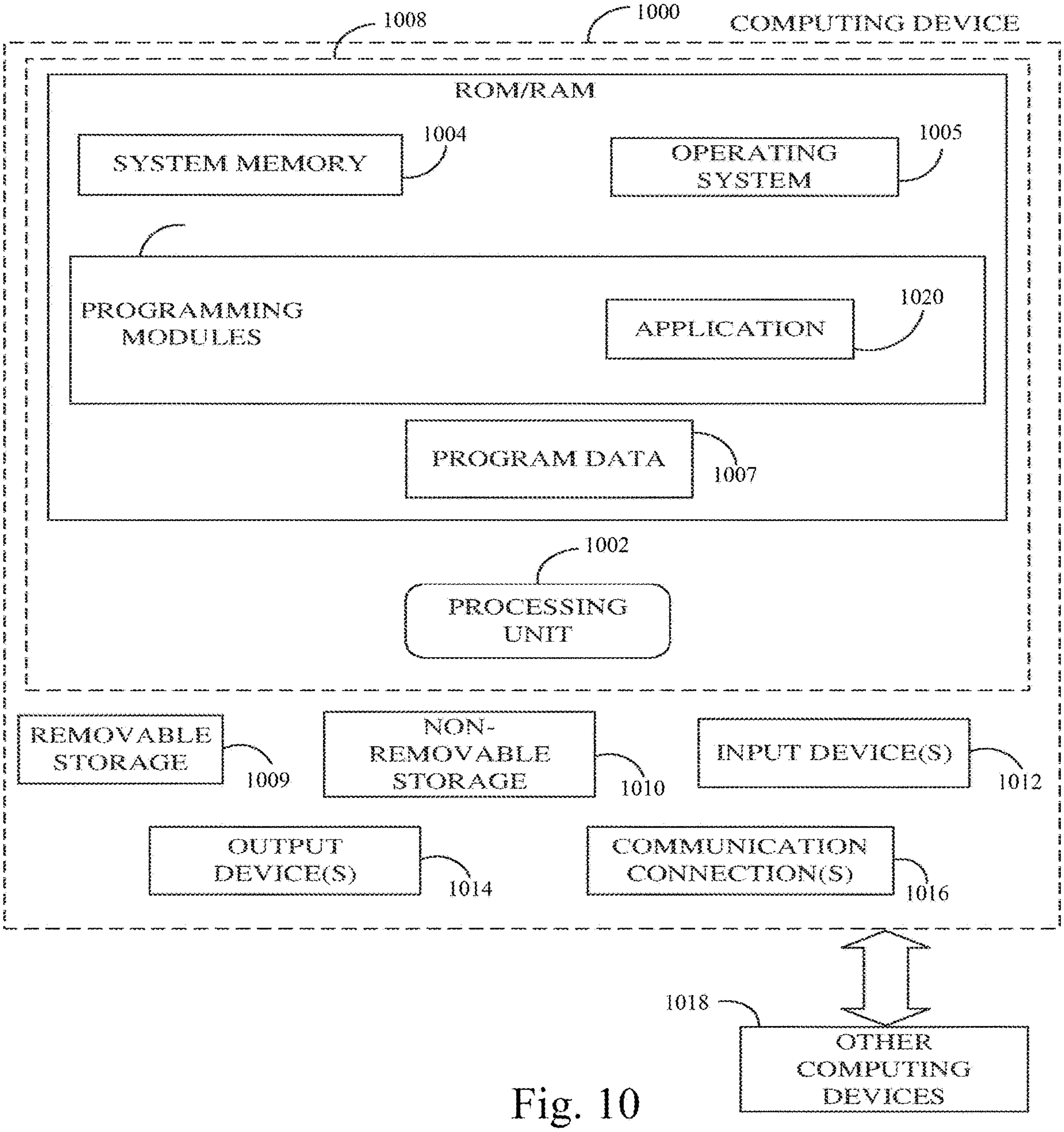
FIG. 10 is a block diagram of a computing device for implementing the methods disclosed herein, in accordance with some embodiments.

With reference to FIG. 10, a system consistent with an embodiment of the disclosure may include a computing device or cloud service, such as computing device 1000. In a basic configuration, computing device 1000 may include at least one processing unit 1002 and a system memory 1004. Depending on the configuration and type of computing device, system memory 1004 may include, but is not limited to, volatile (e.g. random-access memory (RAM)), non-volatile (e.g. read-only memory (ROM)), flash memory, or any combination. System memory 1004 may include operating system 1005, one or more programming modules 1006, and may include a program data 1007. Operating system 1005, for example, may be suitable for controlling computing device 1000's operation. In one embodiment, programming modules 1006 may include image-processing module, machine learning module and/or image classifying module. Furthermore, embodiments of the disclosure may be practiced in conjunction with a graphics library, other operating systems, or any other application program and is not limited to any particular application or system. This basic configuration is illustrated in FIG. 10 by those components within a dashed line 1008.

Computing device 1000 may have additional features or functionality. For example, computing device 1000 may also include additional data storage devices (removable and/or non-removable) such as, for example, magnetic disks, optical disks, or tape. Such additional storage is illustrated in FIG. 10 by a removable storage 1009 and a non-removable storage 1010. Computer storage media may include volatile and nonvolatile, removable and non-removable media implemented in any method or technology for storage of information, such as computer-readable instructions, data structures, program modules, or other data. System memory 1004, removable storage 1009, and non-removable storage 1010 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 1000. Any such computer storage media may be part of device 1000. Computing device 1000 may also have input device(s) 1012 such as a keyboard, a mouse, a pen, a sound input device, a touch input device, a location sensor, a camera, a biometric sensor, etc. Output device(s) 1014 such as a display, speakers, a printer, etc. may also be included. The aforementioned devices are examples and others may be used.

Computing device 1000 may also contain a communication connection 1016 that may allow device 1000 to communicate with other computing devices 1018, such as over a network in a distributed computing environment, for example, an intranet or the Internet. Communication connection 1016 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 1004, including operating system 1005. While executing on processing unit 1002, programming modules 1006 (e.g., application 1020 such as a media player) may perform processes including, for example, one or more stages of methods, algorithms, systems, applications, servers, databases as described above. The aforementioned process is an example, and processing unit 1002 may perform other processes. Other programming modules that may be used in accordance with embodiments of the present disclosure may include sound encoding/decoding applications, machine learning application, acoustic classifiers etc.

Asset operators, ground troops and others involved in military combat may find themselves in complex situations and they may have to make a series of decisions in quick succession to accomplish a mission. These individuals may have a plan and a leader, but each one, or groups of people, still have to make individual decisions based on their training and information that they have about the situation. Communication and adherence to validated tactics is vital in such situations and insightful guidance provides a path to success. AI systems may process vast amounts of combat field data and provide insightful guidance to individuals, groups, leaders, etc. while they are being trained and while they are in combat situations.

There are many combat situations where AI systems may provide useful suggestions to military personnel in training and combat situations. For example, in accordance with an exemplary and non-limiting embodiment, a fighter pilot may be on a mission to escort and protect a strike package on a mission. The flight may encounter enemy fighters approaching to disrupt the package's mission. The escorting fighter pilot(s) has to make a decision on how to deal with the incoming fighters. The enemy may be a simple configuration of a manageable few assets, but the enemy may be a well-organized force with an advanced Integrated Air Defense System (IADS). The fighter pilot, and his flight, must manage this complex situation to accomplish the mission and avoid losses.

In accordance with other exemplary embodiments, there is disclosed a mixed reality optical system designed to provide high-resolution along with a very wide, and tall, field of view (FOV). Some augmented reality glasses achieve approximately 60 degrees horizontal FOV, as a reference. There is disclosed a method for extending the FOV to well over 100 degrees; in some cases, reaching 180 degrees or more. Some designs are essentially only limited by the physical constraints provided by the user's head and mechanical systems holding the optical system. These very wide FOV optics can provide an uninterrupted user view from as far left to as far right as the user can move her eyes and see in her peripheral vision. This creates the ability to create a mixed reality environment (e.g., augmented reality, virtual reality, etc.) where content positioning essentially never 'snaps' out of the field of view while the user can see into the surrounding environment around and behind the virtual content. It is undesirable to have content disappear suddenly when it reaches the end of an artificial field of view, so maximizing the field of view may be considered a requirement for certain applications (e.g., driving a car, piloting an airplane).

There exist limitations in the FOV of a mixed reality system caused by both form factor and optical clarity, distortion, and resolution. From a form factor perspective, many virtual reality headsets have a wide field of view, but the system is front-loaded and relatively heavy, so it does not provide long term wearability. From an optical standpoint, there are a number of different optical arrangements that provide a wide FOV in virtual reality, but the resolution is generally low. The augmented reality headsets generally do not have wide FOVs. And, the augmented reality systems tend to use holographic surfaces, which create a blur and effect resolution.

There is disclosed an optical arrangement to overcome these limitations. The disclosed optical system has an acceptable form factor with a very-wide FOV. The optical system includes the use of curved display panels (e.g., LCD, OLED, MircoLED, etc.) and a matching reflective surface (s). A flat display panel has limitations in both form factor and optical clarity. For example, a flat display panel gets relatively large to produce a high resolution wide FOV, which causes a larger than desirable form factor. A large flat display panel also tends to cause optical distortion around the edges of the FOV because of an optical mismatch between the flat panel emission, transmission, or reflection, and the partially see-through optic in front of the user's eye. However, matching optical surfaces with a curved display panel creates a high-resolution image (e.g., 1040*p*, 4*k*, 8*k*) over essentially the entire FOV, very large FOV (e.g., 100, 120, 140, 160, 180 degrees horizontal), and compactness for a smaller form factor.

Figure 11:
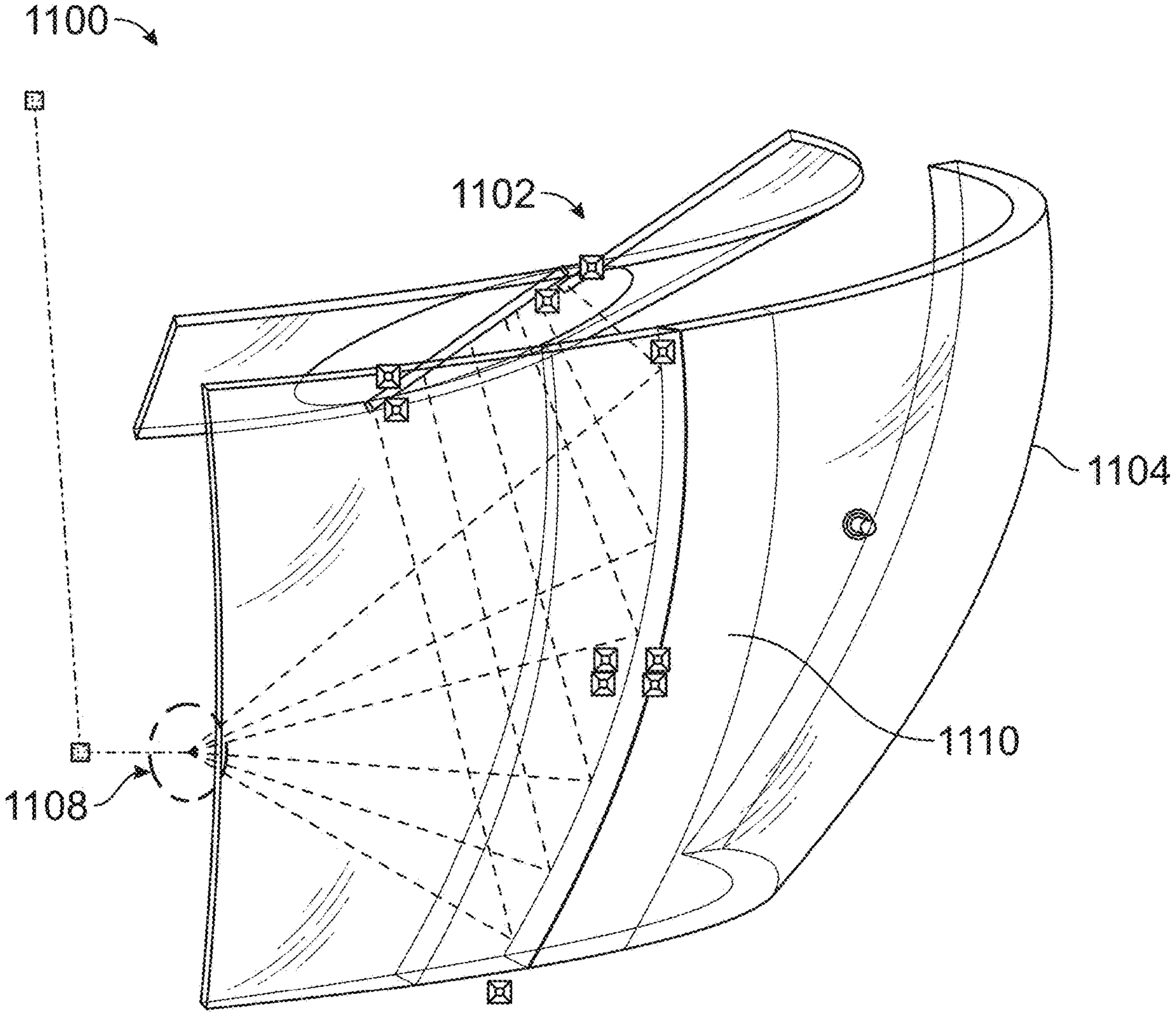
FIG. 11 is an illustration of a mixed reality optical system in accordance with some embodiments.

With reference to FIG. 11, there is illustrated an exemplary embodiment of a mixed reality optical system 1100 in accordance with the principles of the present inventions. A display panel 1102 is fixed into a curved shape (with more detail in FIG. 12). The display panel 1102 emits image light (e.g., OLED, microLED), transmits image light (e.g., backlit LCD) or reflects image light (e.g., LCoS). The image light diverges according to the surface shape of the display panel 1102. A combiner optic 1104, to be positioned in front of a user's eye, is shaped to match the shape of the display panel 1102 such that the image light converges at a point representing a user's eye 1108. The combiner optic may be partially reflective and partially see through (e.g., partial mirror, polarized), reflective (e.g., full mirror) or otherwise depending on the desired application. For example, the combiner optic 1104 may be partially reflective and partially see-through if an augmented reality headset is desired. Or, the combiner optic 1104 may be essentially fully reflective if a virtual reality head set is desired.

The curved shape of the combiner 1104 may be created by determining an intersection of a plane of image light, perpendicular to the display 1102 surface, with a combiner 1104 plane shaped 1110 to reflect the plane of image light through the middle of the eye 1108. Once this image plane intersection is determined, the intersection is rotated about the center of the eye. The curved display 1102 and the curved combiner 1104 can be made as wide as desired, which effectively determines the FOV.

Figure 12:
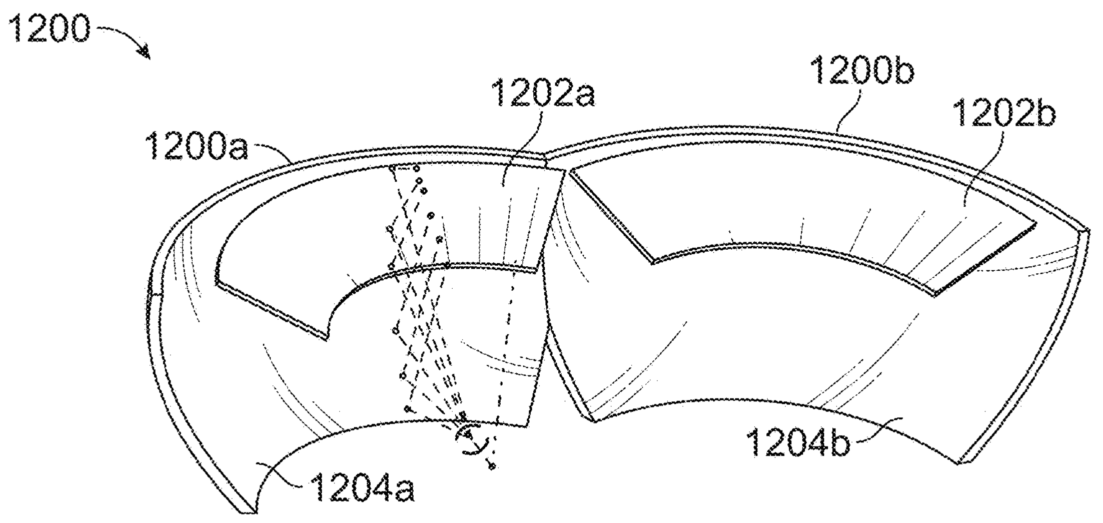
FIG. 12 is an illustration of a binocular mixed reality optical system in accordance with some embodiments.

With reference to FIG. 12, there is illustrated an exemplary embodiment of a binocular mixed reality optical system 1200 in accordance with the principles of the present inventions. The optical system 1200 includes two optical modules 1200, one for each eye of a user. While the shapes of the 1200*a* and 1200*b* modules may be identical or mirror images of one another, the curved display panels 1200*a* and 2100*b* may be independently controlled to display different images for a 3D experience. In embodiments, the displays 1200*a* and 1200*b* are independently controlled, controlled by the same controller, or otherwise controlled and they may present the same image, different images, or one may produce an image while the other does not.

Figure 13:
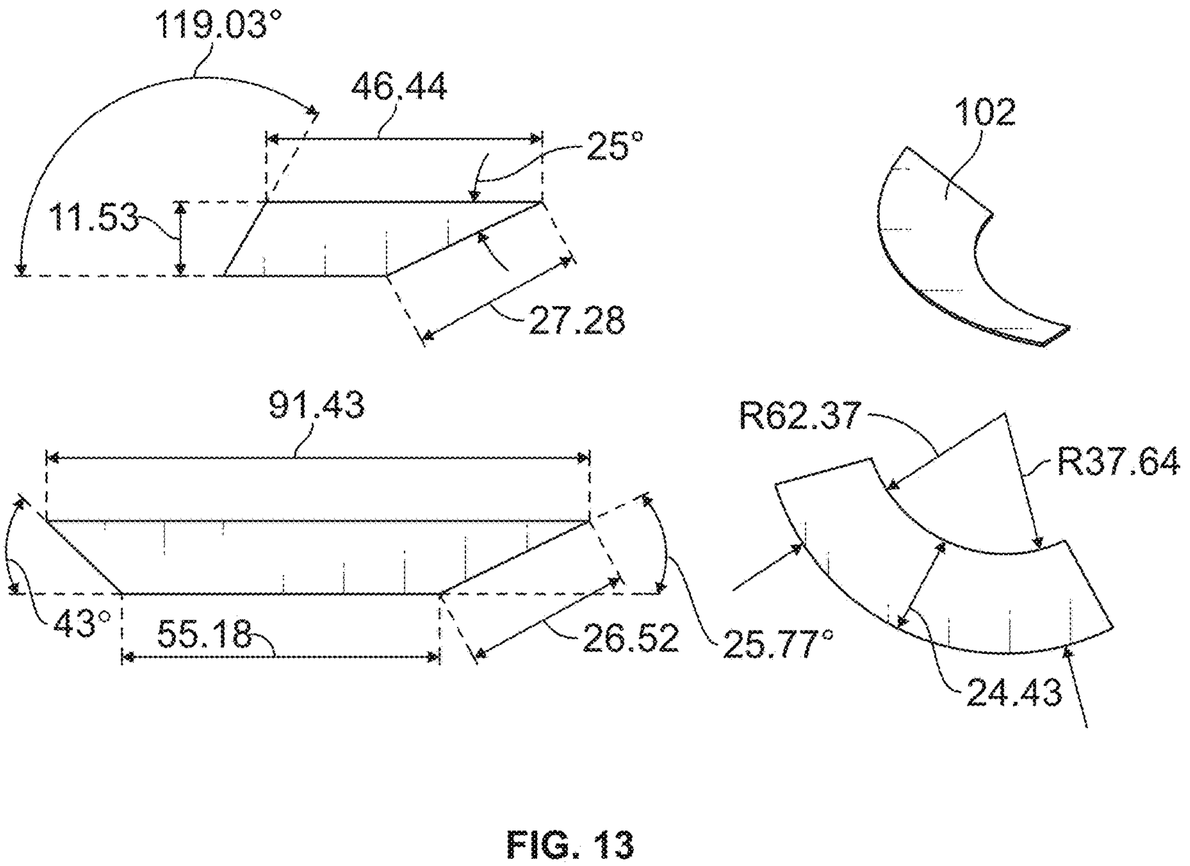
FIG. 13 is an illustration of a curved display panel in accordance with some embodiments.

With reference to FIG. 13, there is illustrated the approximate dimensions of a curved display panel 1102 in accordance with the principles of the present invention that may be used to generate a FOV of over 150 degrees horizontal, when used in connection with a properly shaped combiner 1104.

The combiner 1104 of the mixed reality optical system 1100 and/or binocular mixed reality optical system may be made as a surface on a substrate (e.g., glass, polycarbonate), free-form solid optic, or other form.

The mixed reality optical system 1100 and/or binocular mixed reality optical system may be mounted in a mounting system designed to be head worn (e.g., helmet, glasses, visor) and may be configured for AR, VR or a system that is switchable between AR and VR (e.g., by using an electrochromic surface on the combiner surfaces 1104).

An aspect of the present inventions relates to the modification of the image data at the graphical processing unit ("GPU"). Generally, in computer graphics the GPU draws in triangles to produce the presented graphics. For planar surfaces, such as flat monitors, a pinhole camera model is usually used where it takes the vertices of those millions of triangles and applies a projection matrix. The matrix operates linearly until a "perspective divide" operation is applied to project to the flat 2D image plane. For non-planar surfaces, such as described in connection with the mixed reality optical system 100, the use of the highly mechanized linear algebra techniques are suboptimal. In embodiments, the shape of the screen is defined as a function in 3D space. One may then parameterize the 2D surface of that shape in a way that matches the physical pixels. Then one may generate a non-linear function between the pinhole and the parameterized surface in a way that also does a "perspective divide" to maintain compatibility with existing geometry engines. Using such a technology removes the losses and intermediate calculations of projecting onto a plane and then having to filter/distort it into angle space.

It was discovered that too much curvature in the LCD display panel can cause issues due to misalignment of the LCD pixels and their respective filters (e.g., red, green, blue). In embodiments, the issues may be overcome as described below. It was further discovered that a smaller curvature than that described in connection with FIG. 13 avoids the issues and still provides a wide field of view (e.g., 150 horizontal degrees or more). For example, a minimum bend radius of 250 degrees, as opposed to the 86.5 degrees illustrated in FIG. 13, with an LCD panel that includes filters does not substantially suffer from misalignment issues.

As described above, display panel 1102 may emit image light, transmit image light or reflect image light. In embodiments, such a display may be formed of an LCD layer comprised of a display panel of LCDs that is backlit by an LED panel The LCD panel may include filters (e.g., red green and blue) to filter and transmit appropriate pixel light to form an image. The filter layer may filter the backlight from the LED layer on a pixel by pixel basis. Each pixel of filter layer may be further divided into subpixels representing red, blue and green components of each pixel wherein the sub-pixels of the filter layer correspond to sub-pixels of the LED layer. By altering the relative color and transparency of each sub-pixel, the filter layer can produce a color formed of the combination of varying amounts of red, green and blue.

In such a scenario, the backlight is commonly activated to emit white light via emission from all three sub-pixels while the pixels of the filter layer are activated on a sub-pixel basis to produce a color image on the display. As a result, each pixel and/or sub-pixel of the LCD layer are aligned with and correspond to a pixel and sub-pixels of the filter layer. In practice, such displays are generally flat with both the display layer and filter layer comprising generally flat planes of similar size placed in close proximity to one another. As a result, it is possible to maintain alignment of the pixels and sub-pixels of the LED layer and filter layer.

When, as above, either layer deviates from a flat plane, alignment problems may arise. Specifically, when both layers are curved to provide a wide field of view as described above, it becomes increasingly difficult to maintain pixel alignment between the two layers.

In accordance with exemplary and non-limiting embodiments, this alignment problem may be addressed via temporally separating the provision of red, green and blue as opposed to the spatial separation described above. For example, rather than emitting a white light from a phosphor type LED, red, blue and green light may be emitted by the backlight such that each pixel in the LCD layer emits the color generated by the backlight. By sequencing the color emitted by the backlight very quickly (e.g., r,g,b,r,g,b . . . ) and controlling the LCD pixels to coordinate such as to transmit the appropriate color at the appropriate pixel at the appropriate time, the display becomes full color capable without the need for filters. Once the filters are removed, the filter alignment problem is eliminated and the curved display can work well even with extreme shapes.

By cycling through the emission of red, green and blue light on the order of thousands of times per second, the brain merges the three separate images into a full color whole. Note that there is not required a perfect alignment of the LEDs forming the LED layer and the pixels of the filter layer. Note also that there is no longer the need for sub-pixels as the separation of colored light is achieved via temporal separation rather than spatial separation.

As a result, a curved display may be created which deviates considerably from a flat plane and which may be fabricated to wrap around a viewer's field of view without experiencing any degradation in image fidelity resulting from misalignment at the sub-pixel level of corresponding LED layer and filter layer pixels.

Figure 14:
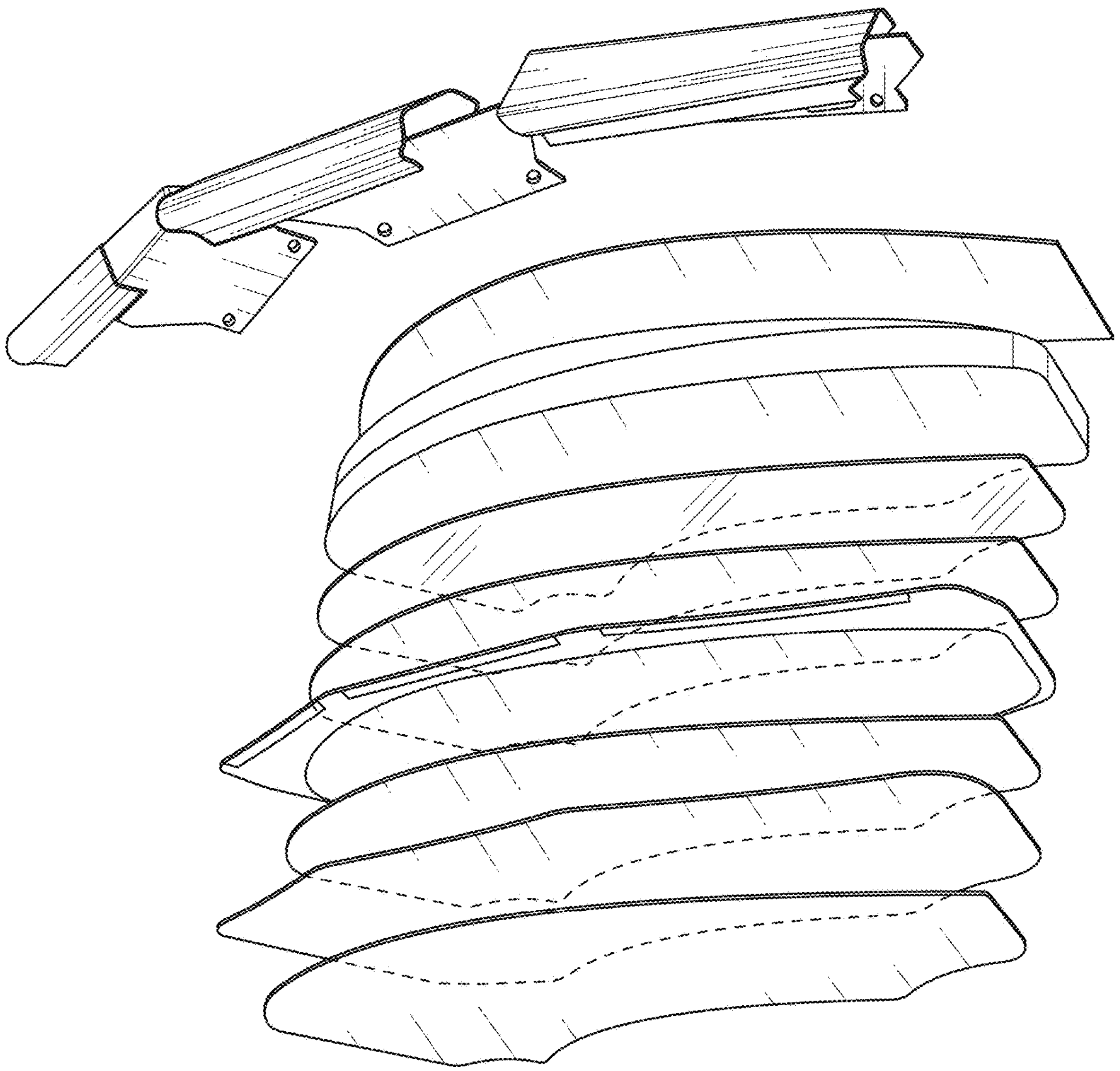
FIG. 14 is an illustration of a curved display in accordance with some embodiments.

With reference to FIG. 14, there is illustrated an exemplary and non-limiting embodiment of a curved display incorporating the temporal color displacement discussed As illustrated, PCBA comprises an LED board functioning as the above described LED backlight. LC signifies the liquid crystal filter layer. Note the wide field of view and curvature of the constituent components.

A number major challenges and solutions are disclosed herein when creating an XR environment for a pilot of a real aircraft. One such challenge originates from the incredibly high brightness encountered when flying on a sunny day. The blue sky and the reflection of the sun off the clouds is so bright it overwhelms conventional see-through XR displays to the point where the digital content is not observable. In addition, there are times when the pilot may want to look near the sun, where an enemy combatant may be lurking. Looking anywhere close to the sun exacerbates the issue because the view becomes much brighter.

The brightness of a cloud reflecting the sun can range from about 10,000 nits to about 20,000 nits, and it gets much higher than that the closer to the sun one looks. This may be compared to the drastic difference one might find in an indoor space, which tends to be 50 to 300 nits. Displays made in accordance with the embodiments of the present inventions are capable of providing 32,000 nits, which is controllable down to below 5 nits. An optical configuration may have an additional surface(s) to reduce the environmental light that transmits through to the XR optical system and the eye of the user.

For example, a tinted shield, electrochromic surface, photochromic, etc. may be mounted exterior to the XR optics. On a helmet, for example, a tinted shield may be mounted in a fixed or movable position to shade the user's eyes. The shield may only transmit 20%, 40%, 60%, etc. of light, such that the user is comfortable in the current environment. If, for example, a 20% transmissive shield was used on a bright day with 10,000 nits, only 2,000 nits would pass through the shield. In embodiments, such a shield may provide the benefit of reducing power usage and reducing heat generation by requiring a lower brightness from the XR system. In addition, the combiners of the XR optical system may also be tinted, polarized, filtered, etc. such that they only transmit some of the light that passes through the shield. For example, the combiners may be 50% 80% transmissive, which, at 50%, would reduce the light passing through the combiners to approximately 16,000 nits. The 1,000 nits would then be the environmental light upon which the XR digital content is presented. This means that the artificial light for the XR content needs to overcome the 1,000 nits, in this example, to be viewable. A backlit display system generating image light at 10,000 nits would, after reflecting off a 50% reflective surface deliver 5,000 nits to the eye. This provides enough image light to substantially overcome the background environmental light to create an acceptable XR experience outdoors on a bright day.

Figure 15:
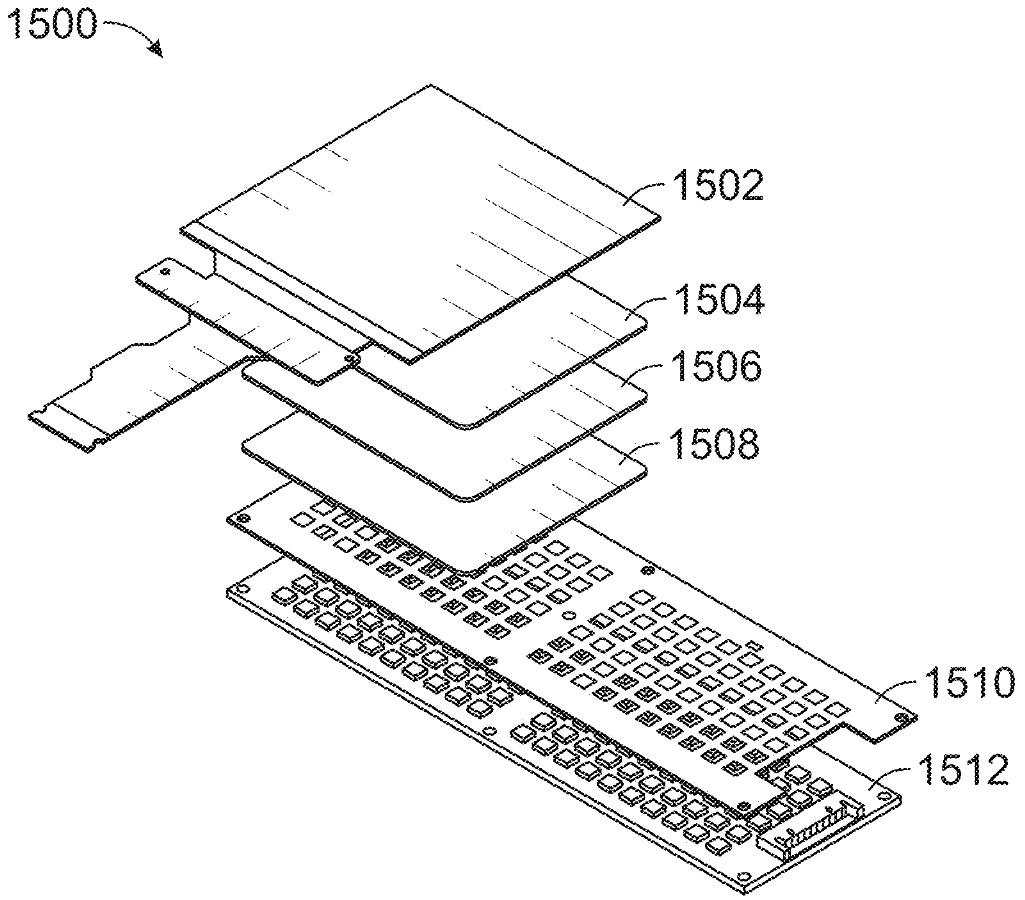
FIG. 15 is an illustration of an exploded view of an exploded view of a backlit LCD display in accordance with some embodiments.

FIG. 15 illustrates an exploded view of a backlit LCD display 1500 in accordance with the principles of the present inventions. Increasing the brightness of the display system that projects images onto a see-through combiner results in a number of problems having to do with optical clarity, consistent brightness throughout the field of view, increased heat, etc. In this embodiment, the LCD is backlit by a plane of LEDs mounted behind the LCD panel. This configuration would generally result in spots of high intensity and spots of low intensity lighting, which passes to the combiner providing an uneven intensity of the content presented on the combiner. To remedy this, certain films are added to manage the light that ultimately passes through the LCD pixels. The first layer above the LED circuit board 1512 is an enhanced spectral reflector ("ESR") 1510 configured to reflect light that has been reflected backwards by the films or LCD back towards the LCD as a recycling effect. This recycling of light contributes to a more energy efficient and thermally efficient design. Without the ESR, a significant portion of the wasted light would be absorbed by the printed circuit board and its components, which would convert to heat that would need to be managed, a very difficult technical problem. The second layer is a diffusion film 1508 with a shiny side (i.e., a relatively high reflective surface) facing the LEDs. This causes light from the LEDs to reflect back and forth between the LED board 1512 and the diffusion film 1508 to spread the light that ultimately passes through the diffusion film 1508. A layer of brightness enhancement film ("BEF") 1506, with a zero-degree orientation is included to reflect, through total internal reflections caused by the prisms on the film, light that is 'off-angle'. This results in recycling of more light and narrowing the beam angle of the light that ultimately passes through the BEF 1508. A layer of BEF with a ninety-degree orientation 1504 is positioned above the first layer of BEF 106. There may be additional films in the optical stack, but in this embodiment, the narrowed beam angle light irradiates the LCD panel 1502 from behind and then passes through activated sub-pixels. The recycling and redirected diffused light produces a substantially evenly lit field of view at a combiner (described below).

The backlit LCD display 1500 represents a high brightness display (e.g., 32,000 nits) and can be dimmed to 100 or fewer nits. This enables, along with other XR optics, a display system that can produce viewable digital content in an outdoor environment on a bright day. The dimming capability provides for adjustments for other than blue-sky days (e.g., cloudy day, evening, night, indoors, etc.). In embodiments, the XR system may include a photodetector or other sensor system to measure the environmental light and then adjust the display lighting brightness to an appropriate light level. In embodiments, the XR system may include a photodetector or other sensor system to measure the display brightness, image brightness, image brightness ("Image Brightness") after reflecting off or through a combiner. These measurements may be used to assess the image brightness that is presented to the eye. In embodiments, the XR system may have both an environmental light sensor and an Image Brightness sensor such that the two can be compared. The system may then operate to dim the display lighting system to follow a relationship between the two (e.g., a fixed ratio, an increasing ratio, a decreasing ratio, a linear relationship, a non-linear relationship). A ratio of approximately 1.5:1 is good. The systems of the present inventions may provide much higher and lower values, but once the ratio gets much higher than 1.5:1 the user's pupil tends to constrict. As the ratio increases much beyond 1.5:1, the pupil tends to constrict more and more. This results in the user's perception that the digital content is maintaining a brightness but the environment begins to darken. While this effect may be desirable in certain situations, it may be undesirable when the goal is to provide both a bright background environment and bright content.

In embodiments, the optical configuration may include an eye tracking sensor. The eye tracking sensor may track the position of the user's eye and/or monitor the size of the user's pupil. If the user's pupil is constricting, it may be an indication that the presented content is too bright and is reducing the environmental light perceived by the user. A processor may monitor pupil size and regulate the brightness of the XR content. The processor may also regulate the transmission of the outer shield and/or combiners in response to pupil size.

While backlit LCD display 1500 illustrates a direct backlighting arrangement (i.e., the plane of the LEDs is similar to the plane of the LCDs) it should be understood that a side lit optical waveguide could also be used. In addition, the backlighting might be folded for certain display configurations. Further, such a lighting system may be used as a front lighting system for a reflective pixelated display (e.g., LCOS, DLP, etc.).

Figure 16:
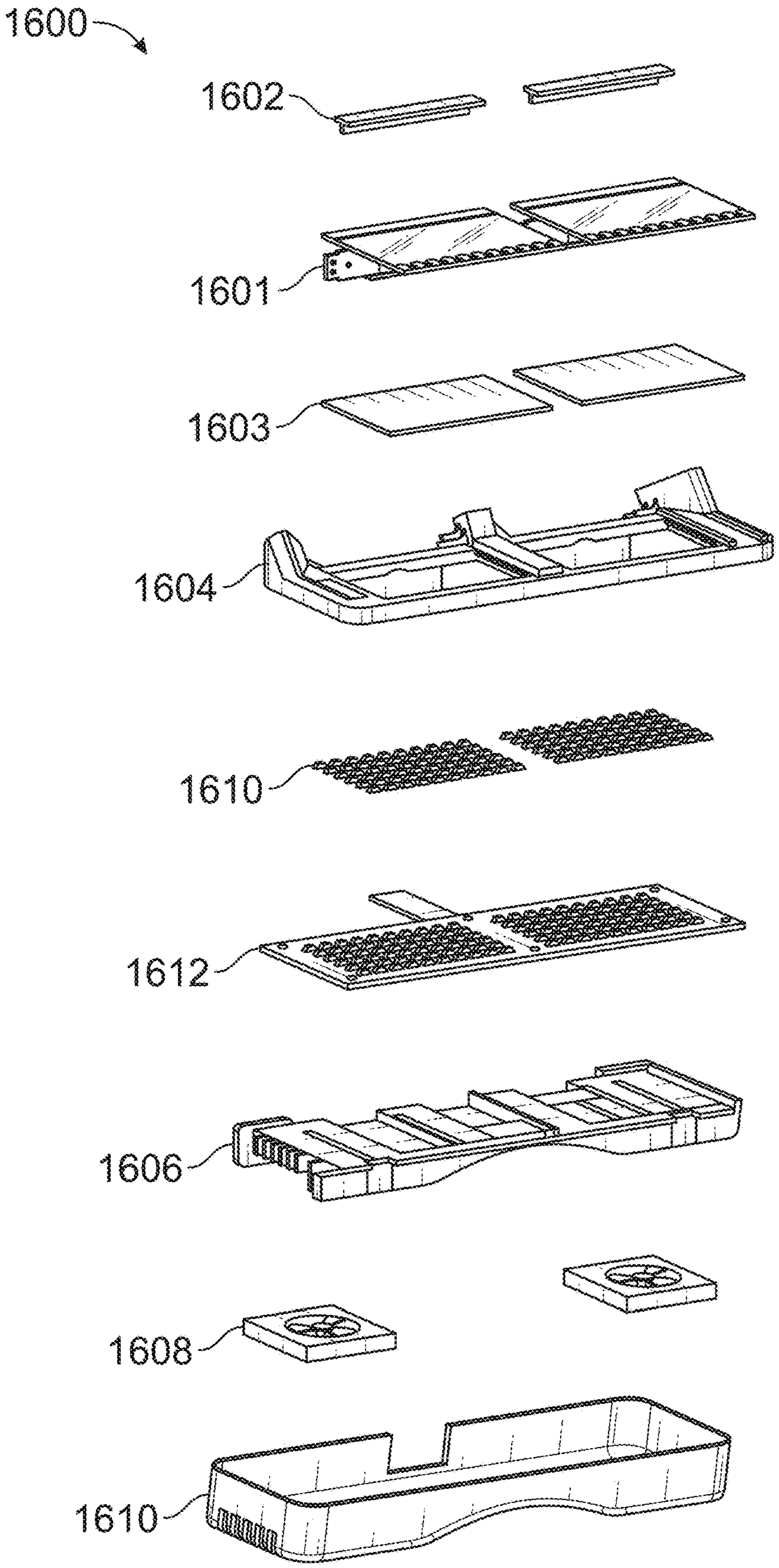
FIG. 16 is an illustration of an exploded view of a bridge assembly in accordance with some embodiments.

In addition to the energy and thermally efficient backlighting of the LCD panel, additional thermal management may be required given the operating environment. In embodiments, a heat sink is thermally connected to the LED PCB to draw the heat backwards, away from the LCD. The heat sink may be metal (e.g., aluminum, titanium, etc.) or other material (e.g., graphine). The heat sink may have features to enhance cooling (e.g., fins) and/or be actively cooled (e.g., with air, water, etc.). The embodiment illustrated in FIG. 16 shows active cooling with fans to actively draw heat from the heat sink into the environment. Directing the air away from the user may be desirable as well. The optical assembly is relatively close to a user's forehead so moving heat away from the user would be generally desirable. Further, directing the airflow away from or not towards the user's eyes helps prevent eye dryness and fatigue.

While LEDs are gaining efficiency at converting electricity into photons at a rapid pace, the high brightness backlight may still draw significant power. In embodiments, the power drawn by each LED panel may be on the order of several watts. This further highlights the need for thermal management of the system. The backlights behind each of the LCD displays illustrated in FIG. 15 have 120 LEDs, each having a specified size being approximately 2.8 mm×2.8 mm. The size of the active area of each LCD display is substantially the same as its backlight, which in this embodiment is approximately 28 mm deep (i.e., front to back) and 51.4 mm wide. In embodiments, each or a sub-group of the LEDs in the backlight may be addressable such that each can be controlled to provide a brightness in association with content displayed at a corresponding position. The control may be continuous, stepped, on-off, etc. In embodiments, the addressed arrangement may be used to increase the brightness of the display in a portion of the field of view where content is being presented and decreased, or turned off, in a portion where no content is presented. This may increase the contrast of the displayed content, save power, reduce heat, etc.

FIG. 16 illustrates an exploded view of a bridge assembly 1600, which contains the backlit LCD display 100 along with other components. In addition to the backlit LCD display components, the bridge assembly 1600 has a back cover 1610, which acts as a main enclosure, two fans 1608 on either end of the assembly to provide active cooling, a heat sink 1606 (e.g., metal such as aluminum or titanium, or other material such as graphene), a top housing 1604 to cover the top of the LED backlight assembly and provide mounting for the LCD displays 1602 and films 1603, and a display gap filler 1602 to position the LCD assembly.

Figure 17:
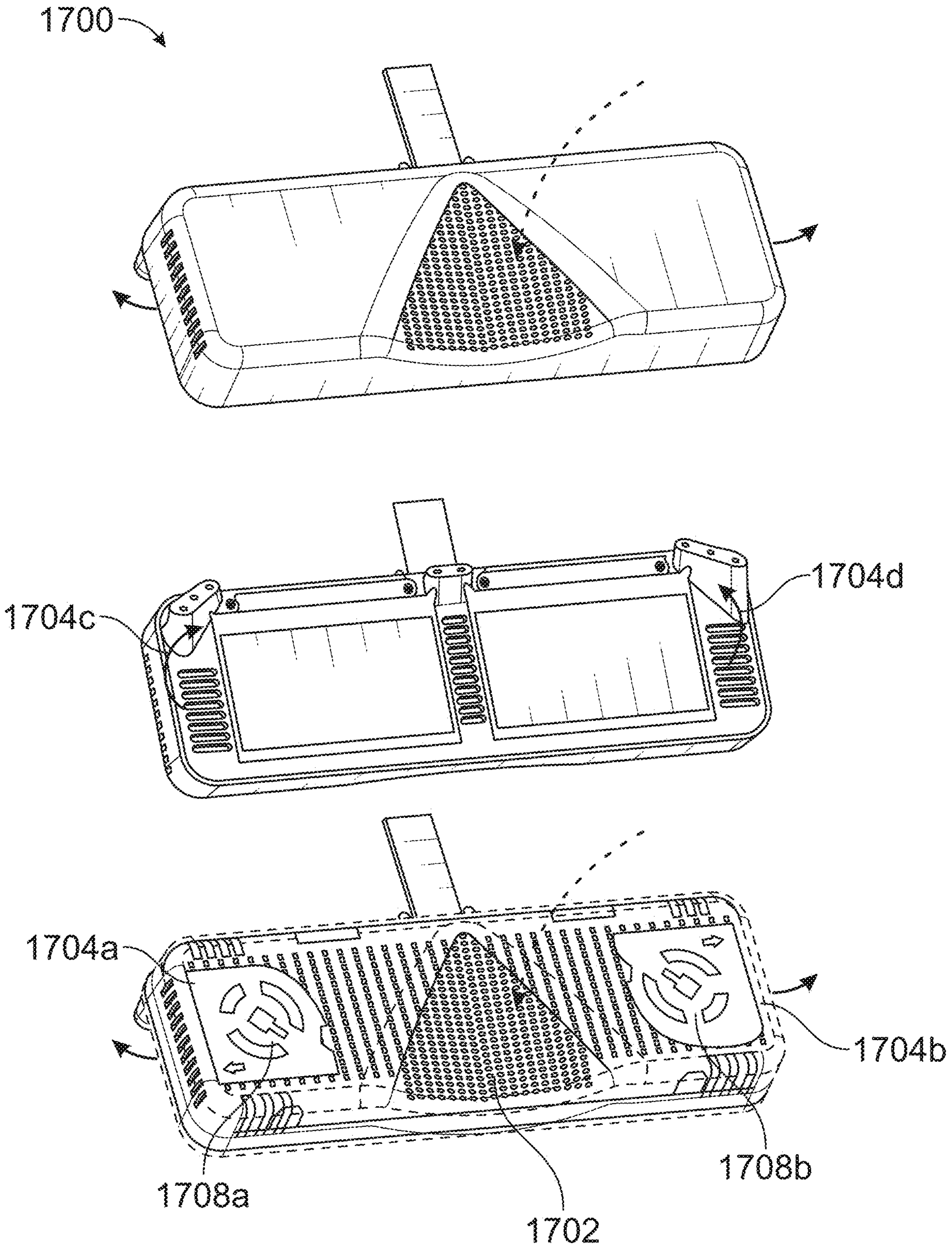
FIG. 17 is an illustration of three separate views of the bridge assembly in accordance with some embodiments.

FIG. 17 illustrates three separate views of the bridge assembly 1700 showing the general airflow through it. Fans 1708*a* and 1708*b* draw cool environmental air into a center vent 1702 and push hotter air, from the heat sink 1706 and other components, back out to the environment through vents 1704*a*, 1704*b*, 1704*c*, and 1704*d*.

Figure 18:
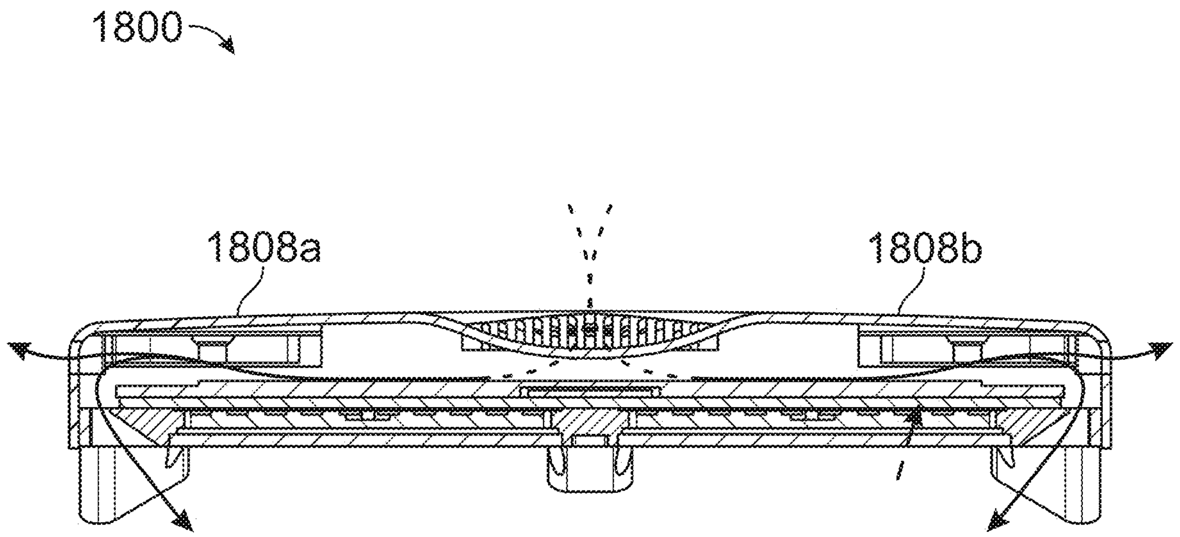
FIG. 18 is an illustration of a cross section of the bridge assembly in accordance with some embodiments.

FIG. 18 illustrates a cross section of the bridge assembly 1800 showing the general airflow within the body. The fans 1808*a* and 1808*b* draw the air into the assembly and force a substantial amount of the air to pass over the heat sink 1806 in opposite directions.

Figure 19:
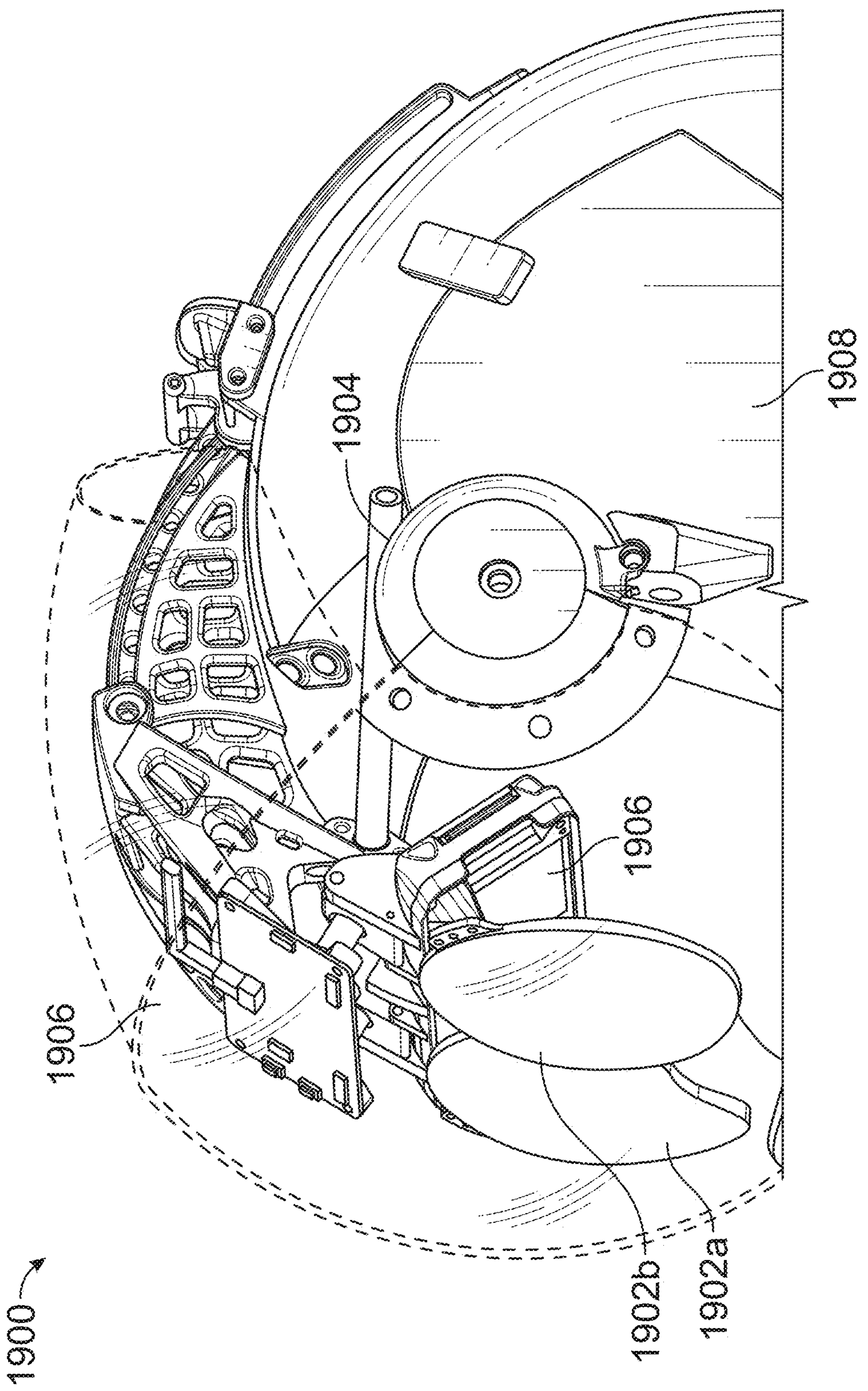
FIG. 19 is an illustration of a three-dimensional view of an XR helmet in accordance with some embodiments.

FIG. 19 illustrates a three-dimensional view of an XR helmet 1900. The bridge assembly 1905 with see-through combiners 1902*a* and 1902*b* mounted on a helmet 1900. The XR see-through display system also needs to be compact to be usable by a pilot or operator of any vehicle while using a helmet. This configuration, with the high brightness displays, produce a horizontal field of view of approximately 70 degrees. This is a very wide field of view and is adequate for the display of content to a user. This system has such high brightness with respect to the external environment that the digital content can be substantially opaque, which was an unexpected result. XR displays that are see-through generally produce relatively faint images that appear substantially see through.

Figure 20:
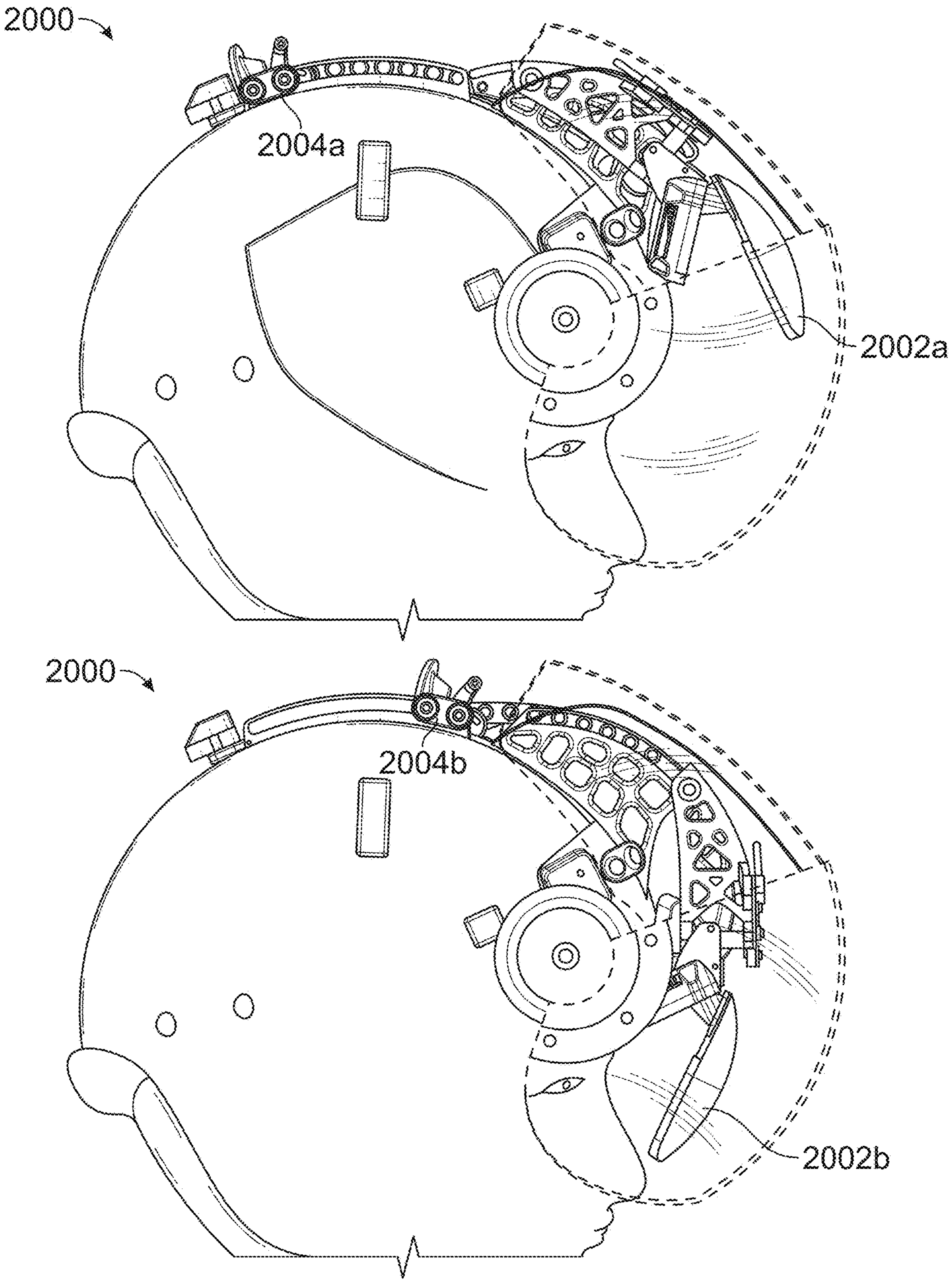
FIG. 20 is an illustration of an XR helmet in accordance with some embodiments.

FIG. 20 illustrates the XR helmet 2000 in two views: one with the XR optics in an active position 2002*a* and one with the XR optics in a non-active position 2002*b*. There are times when a user may want to view XR content and use the mechanical system 2004 to lock the XR optics in the active position 2002*a* so he is seeing through the combiners. There are other times when the user may want to get the XR optics out of the way and use the mechanical system 2004 to lock the XR optics in the non-active position 2002*b*. The sliding mechanism 2004 may be operated with one hand and guide the positioning of the XR optics in and out of position within the confines of the outer shield 1906. The outer shield 506 may be independently positional.

The mechanical system may include a number of other adjusters to cause the XR optics to be properly positioned when in the active position 2002. For example, the adjusters may position the XR optics closer or further from the user's eyes and forehead. This may be important to compensate for helmet positional changes in-flight (e.g., caused by G-forces). There may be interpupillary adjusters to position each combiner to the correct position. There may be eye-box adjusters to move the XR optics within the vertical plane (e.g., up, down, laterally, angularly) to position the eye-box in front of the user's eyes.

An aspect of the present inventions relates to removing or diminishing the brightness of XR content being displayed. In embodiments, a pilot of a real aircraft may be flying in an airspace having pre-defined geo-fenced boundaries and as the pilot approaches a boundary the digital content brightness may be lowered or eliminated to draw the pilot's attention to the surrounding environment. A pupil size monitor may also be used to understand how the current ratio of XR light to environmental light is impacting the user's eye dilation. The content brightness may be reduced to a point where the pupil's size is only effected by the environmental light and then it may be further reduced until it is imperceptible. This controlled dimming may be programmed to take effect over a period of time between a current location and the decreasing distance to the boundary.

While many embodiments herein refer to an XR system, it should be understood that the term XR is meant as an augmented reality system, virtual reality system, mixed system, etc.

Although the invention has been explained in relation to its preferred embodiment, it is to be understood that many other possible modifications and variations can be made without departing from the spirit and scope of the invention.

What is claimed is:

1. A helmet mounted XR display to be worn by a user, said helmet mounted XR display comprising:
- two backlit LCD display panels comprising at least one backlight configured to produce more than 20,000 nits;
- at least one partially see-through combiner positioned to present digital content in the form of image light produced by said backlit LCD display panels to at least one eye of said user such that said user sees said digital content overlaid on an external environment; and
- at least one heat sink in thermal communication with said at least one backlight;
- at least one fan; and
- a bridge assembly configured to hold said two backlit LCD display panels and said at least one fan in relative position to one another, said bridge assembly having at least one central vent and at least one side vent and defining at least one air pathway between said at least one central vent and said at least one side vent such that, when said at least one fan is operating, air enters through said center vent, passes over said heatsink, and is exhausted through said at least one side vent away from said user's eyes.

2. The helmet mounted XR display of claim 1, wherein the backlit LCD display is adapted to provide more than 8,000 nits to the user's eye.

3. The helmet mounted XR display of claim 1, wherein the backlit LCD display is adapted to provide more than 9,000 nits to the user's eye.

4. The helmet mounted XR display of claim 1, wherein the backlit LCD display is adapted to provide no more than 20,000 nits to the user's eye.

5. The helmet mounted XR display of claim 1, wherein the ratio of a brightness of the image light to the brightness of the external environment is approximately 1.5:1.

6. The helmet mounted XR display of claim 1, wherein the helmet mounted XR display is adapted to provide a field of view (FOV) of more than 65 degrees.

7. The helmet mounted XR display of claim 1, further comprising a moveable outer shield.

8. The helmet mounted XR display of claim 1, further comprising a moveable XR system mount.

9. The helmet mounted XR display of claim 1, further comprising an ambient light sensor.

10. The helmet mounted XR display of claim 1, further comprising a display light sensor.

11. The helmet mounted XR display of claim 1, further adapted to control an intensity of the image light based, at least in part, on a size of a user's pupil.

12. The helmet mounted XR display of claim 1, wherein said at least one heatsink comprises one heatsink for said backlit LCD display panels.

13. The helmet mounted XR display of claim 1, wherein said at least one backlight comprises two backlights, one for each of said backlit LCD display panels.

14. The helmet mounted XR display of claim 1, wherein said at least one partially see-through combiner comprises two partially see-through combiners, each combiner corresponding to an eye of said user.

15. The helmet mounted XR display of claim 1, wherein said one or more side vents comprises two or more side vents on either said of said bridge assembly.

16. The helmet mounted XR display of claim 1, wherein said at least one combiner is attached to said bridge assembly such that said at least one combiner and said two backlit LCD display panels are aligned.

* * * * *